United States Patent
Nakayama

(10) Patent No.: US 9,493,869 B2
(45) Date of Patent: Nov. 15, 2016

(54) TRANSPARENT CONDUCTIVE FILM

(75) Inventor: Tokuyuki Nakayama, Ichikawa (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 386 days.

(21) Appl. No.: 13/580,196

(22) PCT Filed: Mar. 16, 2011

(86) PCT No.: PCT/JP2011/056245
§ 371 (c)(1),
(2), (4) Date: Aug. 21, 2012

(87) PCT Pub. No.: WO2011/115177
PCT Pub. Date: Sep. 22, 2011

(65) Prior Publication Data
US 2012/0315439 A1  Dec. 13, 2012

(30) Foreign Application Priority Data

Mar. 19, 2010 (JP) .................................. 2010-063637

(51) Int. Cl.
*C01G 15/00* (2006.01)
*H01B 1/08* (2006.01)
(Continued)

(52) U.S. Cl.
CPC ............... *C23C 14/08* (2013.01); *C01G 15/00* (2013.01); *C01G 15/006* (2013.01); *C04B 35/01* (2013.01); *C04B 37/026* (2013.01); *C23C 14/086* (2013.01); *C23C 14/3414* (2013.01);
(Continued)

(58) Field of Classification Search
CPC .......... C04B 2235/3286; C04B 35/01; C04B 2235/3229; C04B 2235/3232; C04B 2235/9635; C04B 37/026; C23C 14/086; C23C 14/3414; C23C 14/08; C01G 15/00; C01G 15/006
USPC ................ 428/141; 252/520.2, 520.5, 521.1; 204/192.29
See application file for complete search history.

(56) References Cited

U.S. PATENT DOCUMENTS

| 4,743,313 A * | 5/1988 | Makino ............... H01F 1/15316 148/304 |
| 2007/0037402 A1* | 2/2007 | Inoue ............................ 438/758 |

(Continued)

FOREIGN PATENT DOCUMENTS

| JP | 08-260134 A | 10/1996 |
| JP | 09-059787 A | 3/1997 |

(Continued)

OTHER PUBLICATIONS

International Search Report of PCT/JP2011/056245, mailing date of Jun. 7, 2011.

*Primary Examiner* — Laura Auer
(74) *Attorney, Agent, or Firm* — Westerman, Hattori, Daniels & Adrian, LLP

(57) ABSTRACT

A crystalline transparent conductive film containing indium oxide as a main component, and cerium, exhibiting low resistance derived from high refractive index and high carrier electron mobility, as well as small surface roughness, which is obtained by film-formation using an ion plating method. In the film, cerium content is 0.3 to 9% by atom, as an atomic number ratio of Ce/(In+Ce); film-formation is made using an ion plating method; and arithmetic average height (Ra) is 1.0 nm or lower. Also the film can contain one or more of titanium, zirconium, hafnium, molybdenum and tungsten, at a content of 1% by atom or lower, as an atomic number ratio of M/(In+Ce+M).

7 Claims, 5 Drawing Sheets

(51) Int. Cl.
  *C23C 14/08* (2006.01)
  *C04B 35/01* (2006.01)
  *C04B 37/02* (2006.01)
  *C23C 14/34* (2006.01)

(52) U.S. Cl.
  CPC .... *C01P2002/50* (2013.01); *C04B 2235/3229* (2013.01); *C04B 2235/3232* (2013.01); *C04B 2235/3244* (2013.01); *C04B 2235/3284* (2013.01); *C04B 2235/3293* (2013.01); *C04B 2235/5436* (2013.01); *C04B 2235/5445* (2013.01); *C04B 2235/5472* (2013.01); *C04B 2235/6562* (2013.01); *C04B 2235/6565* (2013.01); *C04B 2235/6585* (2013.01); *C04B 2235/6586* (2013.01); *C04B 2235/77* (2013.01); *C04B 2235/783* (2013.01); *C04B 2235/785* (2013.01); *C04B 2235/786* (2013.01); *C04B 2235/80* (2013.01); *C04B 2237/12* (2013.01); *C04B 2237/34* (2013.01); *C04B 2237/407* (2013.01); *Y10T 428/24355* (2015.01)

(56) References Cited

U.S. PATENT DOCUMENTS

| | | | |
|---|---|---|---|
| 2007/0057239 | A1* | 3/2007 | Abe et al. .................. 252/520.2 |
| 2007/0170434 | A1 | 7/2007 | Inoue et al. |
| 2007/0209928 | A1 | 9/2007 | Inoue et al. |
| 2008/0023068 | A1* | 1/2008 | Nakashima et al. .......... 136/256 |
| 2009/0127548 | A1* | 5/2009 | Inoue et al. .................... 257/43 |

FOREIGN PATENT DOCUMENTS

| | | |
|---|---|---|
| JP | 09-176837 A | 7/1997 |
| JP | 09-176841 A | 7/1997 |
| JP | 2004-039531 A | 2/2004 |
| JP | 2005-290458 A | 10/2005 |
| JP | 2005-314734 A | 11/2005 |
| JP | 2005-320192 A | 11/2005 |
| JP | 2009-224152 A | 10/2009 |
| WO | 2006/016608 A1 | 2/2006 |

\* cited by examiner

TRANSPARENT CONDUCTIVE FILM

TECHNICAL FIELD

The present invention relates to a transparent conductive film, in more detail, the present invention relates to a crystalline transparent conductive film containing indium oxide as a main component, and cerium, exhibiting low resistance derived from high refractive index and high carrier electron mobility, as well as small surface roughness, which is obtained by a film formation using an ion plating method.

BACKGROUND ART

A transparent conductive film, because of having high conductivity and high transmittance in a visible light region, has been utilized in an electrode or the like, for a flat panel display or a solar cell and other various light receiving elements, as well as a heat ray reflection film for an automotive window or construction use, an antistatic film, and a transparent heat generator for various anti-fogging for a refrigerator showcase and the like.

As a practical transparent conductive film, there has been included a thin film of tin oxide ($SnO_2$)-type, zinc oxide (ZnO)-type, indium oxide ($In_2O_3$)-type. As the tin oxide-type, the one containing antimony as a dopant (ATO), or the one containing fluorine as a dopant (FTO) has been well known, and as the zinc oxide-type, the one containing aluminum as a dopant (AZO), or the one containing gallium as a dopant (GZO) has been well known. However, the transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

Many of the transparent conductive films are n-type degenerated semiconductors, and electrons of carriers largely contribute to enhance electrical conductivity. Therefore, conventionally, in order to make low resistance of the ITO film, carrier electron concentration has been made to increase as high as possible.

The ITO film has been known to have a crystallization temperature of generally about 190 to 200° C., and bordering on this temperature, an amorphous film is formed at a low temperature side, or a crystalline film is formed at a high temperature side. For example, in the case of film-formation by a sputtering method while maintaining a substrate at room temperature, the amorphous film is obtained, because thermal energy required in crystallization cannot be given. However, in the case where a substrate temperature is crystallization temperature or higher, for example, about 300° C., the crystalline film is formed.

In the amorphous film and the crystalline film of ITO, generation mechanism of carrier electrons is different. In general, in the case of the amorphous ITO, nearly all of the carrier electrons are generated by oxygen deficiency. On the other hand, in the case of the crystalline ITO, generation of the carrier electrons is expected by not only oxygen deficiency but also tin dopant. Indium oxide takes a crystal structure called bixbyite of a stable cubic system crystal phase, under normal pressure or pressure lower than that. By substitution of a lattice point of tri-valent indium in the bixbyite structure with tetra-valent tin, the carrier electrons are generated. Tin is an element which is capable of increasing carrier electron concentration most, as a dopant, and it has been known that the addition of 10% by weight as converted to tin oxide is capable of decreasing resistance most. That is, by converting the ITO film to a crystalline film, carrier electrons are generated in a large quantity by both of oxygen deficiency and the tin dopant, and therefore it is possible to form a film exhibiting lower electric resistance as compared with an amorphous film having only oxygen deficiency.

However, in recent years, with diversification of electronics devices, such a transparent conductive film has been required which shows refractive index higher than that of the ITO film, and low electric resistance equivalent to that of the ITO film. A typical application of such a transparent conductive film includes a blue LED or a solar cell. As a light emitting layer of the blue LED, a gallium nitride layer is used, and an optical characteristics of this gallium nitride layer have a refractive index as high as about 2.4. In order to enhance efficiency of light extraction efficiency from the light emitting layer, it is necessary to enhance consistency of refractive indexes of the transparent conductive film and the gallium nitride layer, and the transparent conductive film is required to have a refractive index of as near as 2.4. Refractive index is a value specific to a substance, and generally known refractive index of indium oxide is as low as 1.9 to 2.0. In addition, the transparent conductive film is required to have low surface resistance. It is because current diffusion is not sufficient in a film surface direction, as electrical characteristics of the gallium nitride layer. However, when it is tried to decrease electric resistance by increasing carrier electron concentration, refractive index of the indium oxide-based transparent conductive film becomes lowered further than 1.9. As described above, because the ITO film is a material having significantly increased carrier (electron) concentration owing to tin as a dopant, trying to obtain a crystalline film with such a low resistance results in decreasing refractive index, and this has been a problem to be solved.

In addition, in the blue LED, other than refractive index or specific resistance, in patterning property or the like by wet etching, characteristics superior than that of the ITO film is required. Therefore, such a production process is preferable that makes low resistance by performing patterning by wet etching using a weak acid on the amorphous transparent conductive film formed at low temperature, and then by heat treatment under non-oxidative atmosphere to crystallize the film. By using this process, it is possible to form a transparent electrode having highly fine patterning.

As applications where the transparent conductive film is required to have superior characteristics over the ITO film, there is a solar cell. In the case where the transparent conductive film having high transmittance of not only visible light but also infrared light is used as a surface electrode of a solar cell, solar light can be captured efficiently. However, in case of ITO film, it is capable of decreasing specific resistance, but because of high carrier electron concentration, there was a problem of high reflectance or absorption of infrared light, and thus decreasing transmittance.

In addition, in the case of using it as a part of a rear surface electrode, there may be the case of using a transparent conductive film having enhanced refractive index, for enhancing incorporation efficiency of solar light and performing the adjustment of refractive index of the whole module. Also in this case, the ITO film was insufficient because of the same reason as in a blue LED application. However, in a solar cell application, because low specific resistance is considered as important, it is not required such high precision patterning by wet etching using a weak acid, that is required in the blue LED.

As one method for enhancing refractive index of the indium oxide-based transparent conductive film, there is a method for adding an oxide having high refractive index.

For example, in PATENT LITERATURE 1, there has been proposed a sputtering target, which is capable of efficiently film-forming a transparent thin film with superior moisture barrier property, and gives little damage to the above silver-based thin film during this film-formation. In this LITERATURE, there has been described a sputtering target composed of an electric conductive transparent metal oxide containing an oxide of a metal element substantially not having a solid solution region with silver, wherein content ratio of the above metal element, substantially not having a solid solution region with silver, is 5 to 40% by atom relative to the metal element of the electric conductive transparent metal oxide. Preferably, it has been described at least a titanium element or a cerium element, as the metal element substantially not having a solid solution region with silver, and indium oxide, as the electric conductive transparent metal oxide.

Further, in the PATENT LITERATURE 1, there has been described that because the metal oxide of the titanium element or the cerium element, of the metal element substantially not having a solid solution region with silver, has a high refractive index of 2.3 or higher, and as said high refractive index material, total content rate of the titanium element and the cerium element is 5 to 40% by atom to the metal element of the electric conductive transparent metal oxide, it is possible to increase refractive index of the transparent conductive film, film-formed by using this sputtering target, up to about 2.1 to 2.3.

In addition, in PATENT LITERATURE 2, there has been proposed a sputtering target of a sintered body of a mixed oxide, having contained tin oxide and/or titanium oxide each in an amount lower than mixing ratio of the substrate, into a mixed oxide having indium oxide and cerium oxide as the substrate, in film-forming a transparent thin film of an conductive film with a composition sandwiching the silver-type thin film, so as to be able to efficiently perform film-formation of the transparent thin film with superior moisture barrier property, and also to provide a sputtering target where the above silver-based thin film little receives damage in this film-formation.

Also in this LITERATURE, similarly as in PATENT LITERATURE 1, there has been described that, because cerium oxide has high refractive index, also refractive index of the mixed oxide of indium oxide and cerium oxide becomes high, accompanying with content ratio of cerium oxide. Further, because, in the mixed oxide of indium oxide and cerium oxide, cerium oxide does not have sufficient electrical conductivity, electrical conductivity of a target of the mixed oxide abruptly decreases accompanying with increase in mixing ratio of cerium oxide, and thus providing a target with low electrical conductivity, which makes direct-current sputtering difficult.

In addition, in PATENT LITERATURE 3, there has been proposed a transparent conductive film having a three-layer structure, where a silver-based thin film having a thickness of 5 to 20 nm is sandwiched by transparent oxide thin films, as a transparent conductive film having high electrical conductivity and visible light transmission, as well as superior storage stability due to little time degradation. In this LITERATURE, there has been described a transparent conductive film where the above transparent oxide thin film is a mixed oxide of a first substrate containing one or more kinds of metal oxides, which easily make a solid solution state with silver, and a second substrate containing one or more kinds of metal oxides, which are difficult to make a solid solution state with silver; and the silver-based thin film is a transparent conductive film, which is a silver alloy containing at least gold, preferably the first substrate is indium oxide and the second substrate is cerium oxide.

In the above PATENT LITERATUREs 1 and 2, there has been described that a film-formation temperature is desirably set at 180° C. or lower or room temperature, and also in Example, the film-formation temperature is 180° C. or lower, and heating treatment after film-formation is performed at 220° C. at the highest, that is, it is heated at lower temperature than crystallization temperature of the transparent conductive film having a composition shown in the Example.

Any of the transparent conductive film with high refractive index, disclosed in these PATENT LITERATUREs 1 to 3, is an amorphous film. To begin with, because the PATENT LITERATUREs 1 and 2 are proposals relating to the transparent conductive film superior in moisture barrier property, the transparent conductive film should be amorphous, similarly as a moisture barrier thin $SiO_2$ film included in the PATENT LITERATURE 1. It is because, in case of a crystalline film, moisture invades via crystal grain boundary, causing damage of the silver thin film. In addition, in the PATENT LITERATURE 3, there has been described that performing of annealing treatment at a temperature of 200° C. or higher is capable of increasing electrical conductivity of the whole three-layer film. However, the object of this annealing treatment is to make low resistance of the silver-based thin film composing a three-layered film, and not to make the transparent thin film crystalline. In a case of forcedly performing of heating treatment at such a high temperature, for example, over 300° C., to make the transparent thin film crystalline, the silver thin film will receive damage also by thermal oxidation.

As described above, the transparent thin films with high refractive index, disclosed in the PATENT LITERATUREs 1 to 3, are only amorphous films, and there has been no disclosure on crystalline transparent conductive films.

Moreover, the PATENT LITERATURE 1 has disclosed electric resistance of a thin film composed of a three-layered structure of a transparent thin film/a silver thin film/a transparent thin film, however, there has not disclosed electric resistance of the transparent thin film alone.

In the PATENT LITERATURE 1, preferable composition range is a cerium element of 10% by atom to an indium element, and it has been confirmed that formation of an amorphous transparent conductive film with this composition at room temperature, so as to have a film thickness of 200 nm, provides a surface resistance of 100 Ω per square, and it is $2.0 \times 10^{-3}$ Ω·cm as specific resistance. A transparent electrode for a blue LED requires a low specific resistance of at least $8.0 \times 10^{-4}$ Ω·cm or lower, however, the amorphous film of the PATENT LITERATURE 1 is difficult to be applied thereto due to having high electrical resistance as above.

On the other hand, PATENT LITERATURE 4 has proposed an amorphous transparent electric conductive thin film having superior smoothness and high work function, an oxide sintered body, which is capable of stable film-formation of said transparent electric conductive thin film, and a sputtering target using the same. And, there has been described that said oxide sintered body desirably contains cerium in 3% by mass to 20% by mass, tin in 0.1% by mass to 4% by mass, and titanium in 0.1% by mass to 0.6% by mass, the remaining being substantially composed of indium and oxygen; and still more, cerium, tin and titanium are in a solid solution state in an indium site; sintered density is 7.0 g/cm$^3$ or higher, and average crystal particle diameter is 3 μm or smaller.

In this PATENT LITERATURE 4, only an amorphous film has been shown, and there has no investigation on formation of a crystalline transparent conductive film using the above sputtering target, or enhancing refractive index thereby. In addition, the oxide sintered body of the PATENT LITERATURE 4 contains tin, however, there has not been referred to adverse effects of tin on decrease in refractive index.

In addition, PATENT LITERATURE 7 has proposed a transparent conductive film only containing indium oxide and cerium oxide, without containing tin or titanium as above. The PATENT LITERATURE 7 has proposed a sputtering target characterized in that, in the case of observing crystal peaks by X-ray diffraction, presence of peaks derived from indium oxide and cerium oxide are observed, and in the case of performing EPMA measurement, diameter of a cerium oxide particle dispersed in indium oxide is measured to be 5 μm or smaller, and still more characterized in that, in the sputtering target composed of indium oxide and cerium oxide, Ce/(In+Ce) is 0.005 to 0.15, and has described film-formation of the transparent conductive film by a sputtering method using this sputtering target. That is, the transparent conductive film of the PATENT LITERATURE 7 contains cerium in 0.005 to 0.15 as Ce/(In+Ce).

In the PATENT LITERATURE 7, there has not been referred to surface roughness of the transparent conductive film at all, however, there was a problem of increased light scattering in an application such as a blue LED or a solar cell, caused by loosing surface smoothness and giving rough surface, because of film-formation of the transparent conductive film by a sputtering method.

In addition, in the PATENT LITERATURE 7, there has been described a production of the transparent conductive film by a production method containing a step for film-formation of the transparent conductive film by a sputtering method using the above sputtering target, and a step for crystallization by heating the transparent conductive film, thus film-formed, at a temperature range of 200° C. to 250° C. However, in the case of containing indium oxide as a main component, and cerium, because of increased crystallization temperature of the transparent conductive film, a sufficiently progressed crystallization state cannot be attained only by heating in a relatively low temperature range of 200° C. to 250° C., although crystallization may happen in some cases. For sufficient progress of crystallization, heating is necessary in a temperature range at least over crystallization temperature by 50° C., that is, in a temperature range over 250° C. The case where crystallization progressed sufficiently provides the transparent conductive film having high mobility of carrier electrons, useful in an application of a blue LED or a solar cell or the like. However, such a film as described in the PATENT LITERATURE 7 has not been possible to attain sufficient characteristics as the transparent conductive film, when considered the application of a blue LED or a solar cell or the like, because of no sufficient progress of crystallization by heating in a low temperature range, and thus no enhancement of carrier mobility.

On the other hand, as another method for obtaining the transparent conductive film with enhanced refractive index, there is also a method for selecting a material exhibiting higher refractive index than that of indium oxide.

For example, PATENT LITERATURE 5 has proposed a transparent metal material composed of a transparent and electric conductive material, which is able to supply stably and is superior in chemical resistance or the like, along with a transparent electrode. In this LITERATURE, there has been described that low resistivity can be expressed while maintaining inner transmittance, by forming an metal oxide layer composed of an anatase-type crystal structure, and composing the metal oxide layer with M:TiO$_2$; as well as electrical conductivity can be extremely enhanced, while maintaining transparency degree, by preparing M:TiO$_2$ obtained by substituting the Ti site of the anatase-type TiO$_2$ with other atoms (Nb, Ta, Mo, As, Sb, W and the like).

Because refractive index of the anatase-type TiO$_2$ is about 2.4, the material of the PATENT LITERATURE 5 is optimal in matching the consistency with refractive index with a gallium nitride layer of the afore-mentioned blue LED. However, sufficient characteristics as a transparent electrode for the blue LED have not been obtained, because of having higher specific resistance by one order as compared with the ITO film. In addition, there is also a problem of slower film-formation rate, as compared with the ITO film, resulting in lower production efficiency.

CITATION LIST

Patent Literature

PATENT LITERATURE 1: JP-A-8-260134
PATENT LITERATURE 2: JP-A-9-176841
PATENT LITERATURE 3: JP-A-9-176837
PATENT LITERATURE 4: JP-A-2005-320192
PATENT LITERATURE 5: JP-A-2006/016608
PATENT LITERATURE 6: JP-A-9-59787
PATENT LITERATURE 7: JP-A-2005-290458
NON-PATENT LITERATURE 1: "Technology of a transparent conductive film (the second Revised version)", Ohmsha, Ltd., published in 2006, pages 56 to 60

SUMMARY OF THE INVENTION

Technical Problem

It is an object of the present invention to provide a crystalline transparent conductive film containing indium oxide as a main component, and cerium, exhibiting low resistance derived from high refractive index and high carrier electron mobility, as well as small surface roughness, which is obtained by using an ion plating method.

Solution to Problem

The present inventors have intensively studied a way to solve the above-described problems and found that the transparent conductive film containing specified amount of cerium in indium oxide, or the indium oxide-based transparent conductive film containing specified amount of a tetra-valent element such as cerium and titanium is not so useful, because of being not able to satisfy both low specific resistance and high refractive index, in an amorphous state, however, when it is made a crystalline state, it becomes to exhibit low specific resistance derived from high carrier electron mobility, as well as high refractive index, thus becomes extremely useful in an application of a blue LED or a solar cell. Further, although high light transmittance is required for a transparent electrode of a blue LED or a solar cell, the present inventors have found that surface of the above crystalline transparent conductive film becomes extremely smooth, when film is formed using an ion plating method, as compared with rough surface of the film in a conventional sputtering method, and have thus completed the present invention.

That is, according to a first aspect of the present invention, there is provided a crystalline transparent conductive film comprising indium oxide as a main component, and cerium, characterized in that, cerium content is 0.3 to 9% by atom, as an atomic number ratio of Ce/(In+Ce); film-formation is made using an ion plating method; and arithmetic average height (Ra) is 1.0 nm or lower.

In addition, according to a second aspect of the present invention, there is provided a crystalline transparent conductive film comprising indium oxide as a main component, and cerium, and further comprising, as a metal element (M element), one or more kinds of the metal element selected from the metal element group consisting of titanium, zirconium, hafnium, molybdenum and tungsten, characterized in that, cerium content is 0.3 to 9% by atom, as an atomic number ratio of Ce/(In+Ce+M); M element content is 1% by atom or lower, as an atomic number ratio of M/(In+Ce+M); film-formation is made using an ion plating method; and arithmetic average height (Ra) is 1.0 nm or lower.

In addition, according to a third aspect of the present invention, in the second aspect, there is provided the crystalline transparent conductive film characterized in that the M element content is titanium.

In addition, according to a fourth aspect of the present invention, in any of the first to the third aspects, there is provided the transparent conductive film, characterized by not comprising tin in the film.

In addition, according to a fifth aspect of the present invention, in any of the first to the fourth aspect, there is provided the transparent conductive film, characterized in that refractive index of a wavelength of 460 nm is 2.1 or larger.

In addition, according to a sixth aspect of the present invention, in any of the first to the fifth aspects, there is provided the transparent conductive film, characterized in that specific resistance is $8 \times 10^{-4}$ Ω·cm or lower.

In addition, according to a seventh aspect of the present invention, in any of the first to the sixth aspects, there is provided the transparent conductive film, characterized in that carrier electron mobility is 35 $cm^2V^{-1}s^{-1}$ or higher.

In addition, according to an eighth aspect of the present invention, in the first aspect, there is provided the transparent conductive film, characterized in that the cerium content is 0.3 to 5% by atom, as an atomic number ratio of Ce/(In+Ce), and specific resistance is $5.0 \times 10^{-4}$ Ω·cm or lower.

In addition, according to a ninth aspect of the present invention, in the eighth aspect, there is provided the transparent conductive film, characterized in that the cerium content is 0.8 to 5% by atom, as an atomic number ratio of Ce/(In+Ce), and specific resistance is $4.0 \times 10^{-4}$ Ω·cm or lower.

In addition, according to a tenth aspect of the present invention, in the second aspect, there is provided the transparent conductive film, characterized in that: cerium content is 0.3 to 5% by atom, as an atomic number ratio of Ce/(In+Ce+M); M element content is 1% by atom or lower, as an atomic number ratio of M/(In+Ce+M); and specific resistance is $5.0 \times 10^{-4}$ Ω·cm or lower.

Advantageous Effects of Invention

The transparent conductive film of the present invention is a crystalline transparent conductive film comprising indium oxide as a main component, and cerium, containable a specified amount of an X element and film-formed using an ion plating method, and because the film is crystalline, it exhibits not only low specific resistance derived from high carrier electron mobility, as well as high refractive index, which was not obtained using a conventional ITO film, but also has extremely smooth film surface, which was not obtained using a conventional sputtering method.

Use of this transparent conductive film in a blue LED enables to match the consistency of refractive index of the transparent conductive film and a gallium nitride layer, which is a light emission layer of a blue LED, and thus enhance light extraction efficiency of from the gallium nitride layer, which is a light emission layer.

In addition, in the case of using the transparent conductive film as a part of a rear electrode of a solar cell, a conventional ITO film had low capturing efficiency of solar light, however, the transparent conductive film of the present invention enables to enhance refractive index and thus enables to enhance incorporation efficiency of solar ray. Further, in the case of using the transparent conductive film as a front surface electrode of a solar cell, the ITO film had high carrier electron concentration, high reflectance or absorption of infrared ray and low transmittance, although having low specific resistance, however, the transparent conductive film of the present invention has low specific resistance, high refractive index, as well as high transmittance of not only visible light but also infrared light, and further suppressed light scattering due to smooth film surface, and enables to be a substitution material as having various characteristics over the ITO film.

DESCRIPTION OF EMBODIMENTS

Explanation will be given below in detail on the transparent conductive film of the present invention, with reference to drawings.

1. Transparent Conductive Film

The transparent conductive film of the present invention is a crystalline transparent conductive film comprising indium oxide, as a main component, and a specified amount of cerium, film-formed using an ion plating method, or further a crystalline transparent conductive film further comprising, as a metal element (M element), specified amount of one or more kinds of the metal element selected from the metal element group consisting of titanium, zirconium, hafnium, molybdenum and tungsten, film-formed using an ion plating method, wherein the former may be referred to as a first transparent conductive film, and the latter may be referred to as a second transparent conductive film, in some cases.

(1-1) The First Transparent Conductive Film

The first transparent conductive film of the present invention is a crystalline transparent conductive film comprising indium oxide as a main component, and cerium, characterized in that: cerium content is 0.3 to 9% by atom, as an atomic number ratio of Ce/(In+Ce); film-formation is made using an ion plating method; and arithmetic average height (Ra) is 1.0 nm or lower.

In the first transparent conductive film of the present invention, it is necessary that cerium content is 0.3 to 9% by atom, as an atomic number ratio of Ce/(In+Ce). The cerium content below 0.3% by atom does not generate the minimum required carrier electrons, which in turn increases specific resistance of the transparent conductive film to higher than $8 \times 10^{-4}$ $\Omega \cdot cm$, and thus it is not preferable. On the other hand, the cerium content over 9% by atom in atomic number ratio tends to decrease the carrier electron mobility, resulting in increase in specific resistance. It is preferable that the cerium content is 0.5 to 8% by atom, as an atomic number ratio of Ce/(In+Ce), and more preferably 0.8 to 7% by atom.

Figure 2:
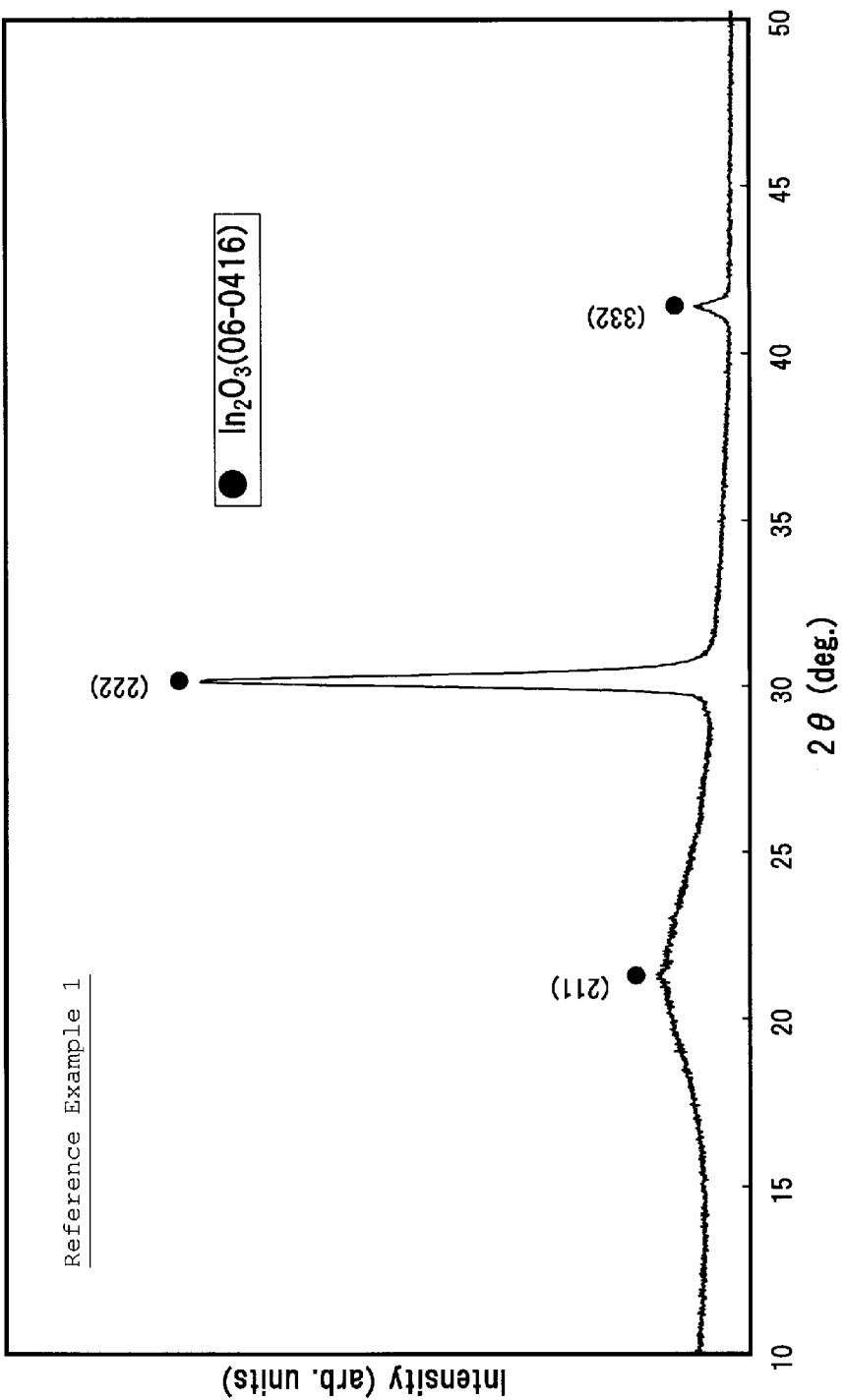
FIG. 2 is a chart showing X-ray diffraction measurement result of a crystalline transparent conductive film formed in Reference Example 1.

In addition, it is preferable that the transparent conductive film of the present invention is a crystalline transparent conductive film, wherein only diffraction peaks derived from a crystalline indium oxide phase are observed in X-ray diffraction measurement ($2\theta/\theta$). FIG. 2 shows X-ray diffraction measurement result of a crystalline transparent conductive film. In a composition of this film, the cerium content is 9% by atom, as an atomic number ratio of Ce/(In+Ce). The film is formed by a direct current sputtering method at a substrate temperature of 500° C., and has a film thickness of about 200 nm. It is understood that the film is sufficiently crystallized and has relatively high crystallinity, because of observation of peaks at each position of $2\theta \approx 30.5°$ ((222) plane), 22° ((211) plane), and 42° ((332) plane), of the chart. This is also similar in the transparent conductive film of the present invention formed by an ion plating method using a tablet having the same component composition.

In the present invention, it is important that the transparent conductive film is crystalline, different from the PATENT LITERATURE 1. Explanation will be given here on effect of the addition of cerium in the crystalline film on decrease in specific resistance. In a crystalline film, it is considered that tetra-valent cerium substitutes a lattice point of tri-valent indium of the bixbyite structure, as described above, however, effect generating the carrier electrons is extremely low, different from other tetra-valent elements such as tin. Behavior of cerium in such a crystalline film has not been known conventionally at all.

A conventional transparent conductive film having indium oxide as a main component and being added with cerium has been a substantially amorphous film, as described in the PATENT LITERATURES 1 to 3. In this case, because finally a transparent conductive film containing indium oxide as a main component and being added with cerium has a three-layer laminated structure, where a silver-based thin film is sandwiched by transparent conductive films, the transparent conductive film is required to be superior in barrier property to protect the silver-based thin film from damage caused by moisture. In addition, it is necessary that the transparent conductive film having indium oxide as a main component and being added with cerium is etched using the same etchant as in the silver-based thin film having low chemical resistance, to fabricate as a wiring having a three-layer laminated structure, as described in the PATENT LITERATURE 6. To satisfy both barrier property and etching property, in this way, it is essential to be amorphous. In the case of a crystalline film, there is raised a problem that sufficient barrier property is not obtained, or it cannot be etched using the same etchant as in the silver-based thin film.

For example, in the PATENT LITERATURE 1, there has been described that film-formation of an amorphous transparent conductive film at a substrate temperature of 180° C. or lower or at room temperature is desirable. In Example 2, the transparent conductive film has been formed on a glass substrate maintained at a low temperature of 180° C. or lower, with a DC magnetron sputtering apparatus, using a sputtering target composed of a mixture of indium oxide, titanium oxide and cerium oxide, where content of an indium element is 80% by atom, content of a titanium element is 16% by atom (20% by atom to the indium element) and content of cerium is 4% by atom (5% by atom to the indium element), that is cerium content is 4.8% by atom, as an atomic number ratio of Ce/(In+Ce). And, there has been described that film-formation of a transparent thin film with a thickness of 37.5 nm, a silver thin film with a thickness of 15 nm and a transparent thin film with a thickness of 37.5 nm was continuously performed, and then a glass substrate with these thin films was heat treated under conditions of 220° C. for 1 hour. By specifying total content of titanium and cerium as above, a film formed becomes amorphous and it becomes possible to maintain an amorphous state even after heating treatment at 220° C.

It should be noted that, a heater for heating a substrate of a general sputtering apparatus usually provides a maximum heating temperature of 250° C., or 300° C. at the highest, which was a reason for a crystalline transparent conductive film has not been investigated conventionally.

The transparent conductive film of the present invention suppresses generation of carrier electrons only in a small amount, as described above, even in the case where cerium is added up to 9% by atom at the maximum, as an atomic number ratio of Ce/(In+Ce). On the other hand, the carrier electron mobility is extremely enhanced by becoming a crystalline film, and specific resistance is decreased than an amorphous film. Such enhancement of the carrier electron mobility, and still more decrease in specific resistance thereby have not been known conventionally.

In the transparent conductive film of the present invention, cerium provides optical effect, that is, enhancing effect of refractive index, in addition to the above decrease in specific resistance. As described in the PATENT LITERATUREs 1 to 3, also in an amorphous film, enhancing effect of refractive index can be obtained by cerium. However, in a crystalline film, higher effect than in an amorphous film can be obtained. As described in the PATENT LITERATURE 1, in a transparent state, the lower generation of carrier electrons provides the higher reflectance, that is, the higher refractive index. As described above, in the case where cerium is contained in the crystalline film in a suitable amount, generation of carrier electrons is only in the minimum amount necessary to exhibit low specific resistance, which increases refractive index.

On the other hand, in the case an amorphous film, cerium has low generation capability of carrier electrons, similarly as in a crystalline film, and still more, does not exhibit high mobility, different from the case of a crystalline state, and after all, realization of low specific resistance depends on generation of a large amount of carrier electrons by oxygen deficiency. Therefore, in the amorphous film, reflectivity in a transparent state is not so high, that is, refractive index is not increased so high.

Accordingly, in the crystalline film, cerium itself not only has increasing effect of refractive index but also does not generate carrier electrons so much and decreases specific resistance, which can be said favorable to increase refractive index.

As explained above in detail, it has not been reported conventionally and is a newly discovered fact that cerium contained in the crystalline transparent conductive film, having indium oxide as a main component, has extremely low generation effect of carrier electrons, and thus enhances carrier electron mobility.

The first transparent conductive film of the present invention becomes a film with high smoothness of film surface, although being crystalline, by being film-formed using an ion plating method, and containing indium oxide as a main component, and cerium. Smoothness of film surface is 1.0 nm or lower in arithmetic average height (Ra), and the lower this value provides the higher smoothness. By making film surface of the transparent conductive film smooth, light scattering is suppressed, resulting in being possible to enhance the efficiency of a blue LED or a solar cell.

Reason for film surface to exhibit smoothness in this way is considered that crystallization temperature is raised by adding cerium, as well as by film-formation of the transparent conductive film of the present invention using an ion plating method. It is inferred that thus raised crystallization temperature decreases nucleus generation frequency of a crystal particle, resulting in formation of a flat crystal particle with relatively large particle diameter, which decreases arithmetic average height (Ra). On the contrary, in the case of film-formation using a sputtering method, even when crystallization temperature is raised by cerium, film surface smoothness is lost, by factors such as the crystalline film formed is sputtered again, or the film is damaged by irradiation of high speed oxygen ions from an erosion region of an oxide sintered body target and the like. In this respect, the transparent conductive film of the present invention is largely different from the transparent conductive film having been proposed in the PATENT LITERATURE 7.

The first transparent conductive film of the present invention enables to select as appropriate cerium content in a range of 0.3 to 9% by atom, as the atomic number ratio of Ce/(In+Ce), depending on applications thereof.

It should be noted that in the PATENT LITERATURE 1, there has been described that a metal oxide, $SnO_2$, can be contained in a film. However, in the transparent conductive film of the present invention, tin should not be included. It is because, in the case of containing tin, even in a small amount, extreme increase in carrier electron concentration causes decrease in refractive index, resulting in impairing characteristics of the transparent conductive film of the present invention. It should be noted that contamination in such an extremely trace amount, as a level of inevitable impurities, does not raise any problem, because influence thereof on characteristics is negligible.

It is preferable that the first transparent conductive film of the present invention has a refractive index of a wavelength of 460 nm of 2.1 or larger. By increasing refractive index to 2.1 or higher, as compared with a general ITO film (refractive index: 1.9 to 2.0) in this way, in particular, an ITO film exhibiting low refractive index (refractive index: 1.8 to 1.9), consistency of refractive index to a gallium nitride layer, which is a light emitting layer, in the blue LED, becomes good, and it is expected to provide enhancement of luminous efficiency.

In addition, it is preferable that the first transparent conductive film of the present invention has a specific resistance of $8\times10^{-4}$ Ω·cm or lower. In particular, because a p-type gallium nitride layer has low current diffusion capability in a film surface direction, as electric characteristics, it is necessary to efficiently make emit light from the whole element surface, by sufficiently decreasing specific resistance of the transparent conductive film.

Still more, it is preferable that the transparent conductive film of the present invention has a carrier electron mobility of 35 $cm^2V^{-1}s^{-1}$ or higher. It is because, by increasing carrier electron mobility and suppressing carrier electron concentration low, both of the above low specific resistance and high refractive index can be attained.

In the case of the first transparent conductive film, it is preferable that the cerium content is 0.3 to 5% by atom, as an atomic number ratio of Ce/(In+Ce), and specific resistance is $5.0\times10^{-4}$ Ω·cm or lower, in an application requiring lower specific resistance. Still more, by making cerium content in a range of 0.8 to 5% by atom, as an atomic number ratio of Ce/(In+Ce), specific resistance can be made to $4.0\times10^{-4}$ Ω·cm or lower.

(1-2) The Second Transparent Conductive Film

The second transparent conductive film of the present invention is a crystalline transparent conductive film comprising indium oxide as a main component, and cerium, and further comprising, as a metal element (M element), one or more kinds of the metal element selected from the metal element group consisting of titanium, zirconium, hafnium, molybdenum and tungsten, characterized in that: cerium content is 0.3 to 9% by atom, as an atomic number ratio of Ce/(In+Ce); M element content is 1% by atom or lower, as an atomic number ratio of M/(In+Ce+M); film-formation is made using an ion plating method; and arithmetic average height (Ra) is 1.0 nm or lower.

In the second transparent conductive film, the cerium content is 0.3 to 9% by atom, as an atomic number ratio of Ce/(In+Ce). The atomic number ratio of cerium below 0.3% by atom does not generate the minimum required carrier electrons, which in turn increases specific resistance of the transparent conductive film to higher than $8.0\times10^{-4}$ Ω·cm, and thus it is not preferable. On the other hand, the cerium atomic number ratio over 9% by atom tends to decrease the carrier electron mobility, resulting in increase in specific resistance.

In addition, the M element has function to enhance carrier electron concentration in the crystalline transparent conductive film containing indium oxide as a main component, and cerium. It is preferable that content thereof is 1% by atom or lower, as an atomic number ratio of M/(In+Ce+M). The M element contained in an indium oxide-based thin film generate more easily carrier electrons, as compared with cerium, and the atomic number ratio as M/(In+Ce+M) over 1% by atom increases excessively carrier electron concentration, resulting in decrease in refractive index. Accordingly, it is preferable that the atomic number ratio of the M element is 1% by atom or lower.

In addition, in the second transparent conductive film of the present invention, it is particularly preferable that the M element content is titanium. Provided that the M element is titanium, it is set that the cerium content is 0.3 to 9% by atom, as an atomic number ratio of Ce/(In+Ce); and the M element content is 1% by atom or lower, as an atomic number ratio of M/(In+Ce+M).

In the PATENT LITERATURE 1, there has been described that an oxide of a metalloid, $SiO_2$, $GeO_2$, $Sb_2O_5$ and $BiO_2$, or an oxide of a metal, $SnO_2$, may be contained. However, in the transparent conductive film of the present invention, titanium, zirconium, hafnium, molybdenum and tungsten may be contained, an oxide of a metal element of tetra-valent or higher valent should not be contained other than these.

In the case of containing the oxide of a metalloid, $SiO_2$ or the like, even in a small amount, extreme increase in carrier electron concentration causes decrease in refractive index, resulting in impairing characteristics of the transparent conductive film of the present invention. It should be noted that contamination in such an extremely trace amount, as a level of inevitable impurities, does not raise any problem, because influence thereof on characteristics is negligible.

In the second transparent conductive film of the present invention, it is preferable that refractive index of a wavelength of 460 nm is 2.1 or larger. By increasing refractive index to 2.1 or higher in this way, consistency of refractive index to a gallium nitride layer, as a light emission layer of the blue LED, becomes good, as compared with a general ITO film (refractive index: 1.9 to 2.0), in particular, an ITO film exhibiting low refractive index (refractive index: 1.8 to 1.9), and thus enhancement of luminous efficiency is expected.

In addition, in the second transparent conductive film of the present invention, it is preferable that specific resistance is $8 \times 10^{-4}$ Ω·cm or lower. The gallium nitride layer has low current diffusion capability in a film surface direction, as electric characteristics, it is necessary to emit light efficiently from the whole element surface, by decreasing sufficiently specific resistance of the transparent conductive film. Still more, it is preferable that the transparent conductive film of the present invention has a carrier electron mobility of 35 $cm^2V^{-1}s^{-1}$ or higher. By increasing carrier electron mobility and suppressing carrier electron concentration low, both of the above low specific resistance and high refractive index can be attained.

The second transparent conductive film of the present invention, similarly as the first transparent conductive film of the present invention, has high film surface smoothness while being crystalline, by being film-formed using an ion plating method, and containing indium oxide as a main component, and cerium. As described above, the second transparent conductive film also contains the M element additionally, however, exhibits similar characteristics as the first transparent conductive film, because cerium has extremely higher effect of raising crystallization temperature, as compared with the M element. That is, also in the case of adopting the second transparent conductive film of the present invention as a transparent electrode, because of having high film surface smoothness, light scattering is suppressed, resulting in being possible to enhance the efficiency of a blue LED or a solar cell.

In the case of the second transparent conductive film, for applications to require lower specific resistance, it is preferable that the cerium content is 0.3 to 5% by atom, as an atomic number ratio of Ce/(In+Ce+M); the M element content is 1% by atom or lower, as an atomic number ratio of M/(In+Ce+M); and the specific resistance is $5.0 \times 10^{-4}$ Ω·cm or lower.

2. Production Method for the Transparent Conductive Film

As a method for producing the transparent conductive film of the present invention, an ion plating method is adopted. The transparent conductive film of the present invention contains indium oxide as a main component, and cerium or a further metal element other than cerium, and by controlling to such a composition, crystallization temperature is enhanced. In the present invention, in addition to this, by adopting an ion plating method, extremely high smoothness, as shown by arithmetic average height (Ra) of 1.0 nm or lower, is attained, even when the transparent conductive film is crystalline.

As the crystalline transparent conductive film having indium oxide as a main component, for example, it is a general case to be judged smooth, when the arithmetic average height (Ra) is 2.0 nm or lower, however, as compared with this, the transparent conductive film of the present invention can be said to be outstandingly smooth. In addition, it is possible to attain film surface smoothness in a level of the arithmetic average height (Ra) of 1.0 nm or lower, also using a vacuum deposition method. However, it is necessary to set substrate temperature higher than an ion plating method, to form a crystalline transparent conductive film exhibiting sufficiently low specific resistance and high carrier mobility. However, a sputtering method, which has been adopted conventionally as a production method for an ITO film or the like, cannot attain film surface smoothness in a level of the arithmetic average height (Ra) of 1.0 nm or lower.

In the case of a sputtering method, a crystalline transparent conductive film or an amorphous transparent conductive film is formed on a substrate, by using an oxide sintered body target containing indium oxide as a main component, and cerium, or an oxide sintered body target containing still more other metal element (M element) other than cerium, arranging a substrate and the target inside a sputtering apparatus, maintaining the substrate at predetermined temperature in argon inert gas atmosphere containing oxygen gas, and applying an electric field between this substrate and the target to generate plasma between the target and the substrate. In a usual magnetron sputtering method, argon ions in plasma collide intensively onto a specified region of the target. This region is eroded intensively, and is generally called an erosion region. Metal ions such as indium ions, which compose the oxide sintered body target, jump out mainly from the erosion region to deposit a film, and along with this, high speed oxygen ions are also irradiated. However, this oxygen ion gives damage to the crystalline or amorphous transparent conductive film, causing elimination of film surface smoothness and increase in arithmetic average height (Ra).

On the contrary, in the present invention, a crystalline film is formed and produced on a substrate using an ion plating method, by setting the substrate in a range from room temperature to about 300° C. It should be noted that, in an ion plating method, because kinetic energy of particles is higher compared with a sputtering method, sufficient crystallization progresses even when substrate temperature is in a low temperature range as above, which thus enables to form the transparent conductive film of the present invention having high mobility of electrons as carriers.

As a method for producing the transparent conductive film of the present invention, an ion plating method is adopted. In the ion plating method, the transparent conductive film is formed on a substrate using a tablet (or it may also be referred to as a pellet) prepared from the oxide sintered body. It should be noted that, in producing the first transparent conductive film of the present invention, such a tablet is used as obtained by fabrication of an oxide sintered body containing indium oxide as a main component, and cerium in an amount of 0.3 to 9% by atom, as an atomic number ratio of Ce/(In+Ce), while in producing the second transparent conductive film of the present invention, such a tablet is used as obtained by fabrication of an oxide sintered body where cerium content is 0.3 to 9% by atom, as an atomic number ratio of Ce/(In+Ce+M), and M element content is 1% by atom or lower, as an atomic number ratio of M/(In+Ce+M).

It is preferable that the oxide sintered body to be used in the present invention has the same composition as that of the transparent conductive film of the present invention. This is in the premise that a composition of the oxide sintered body of a raw material is reflected to the transparent conductive film formed.

Figure 1:
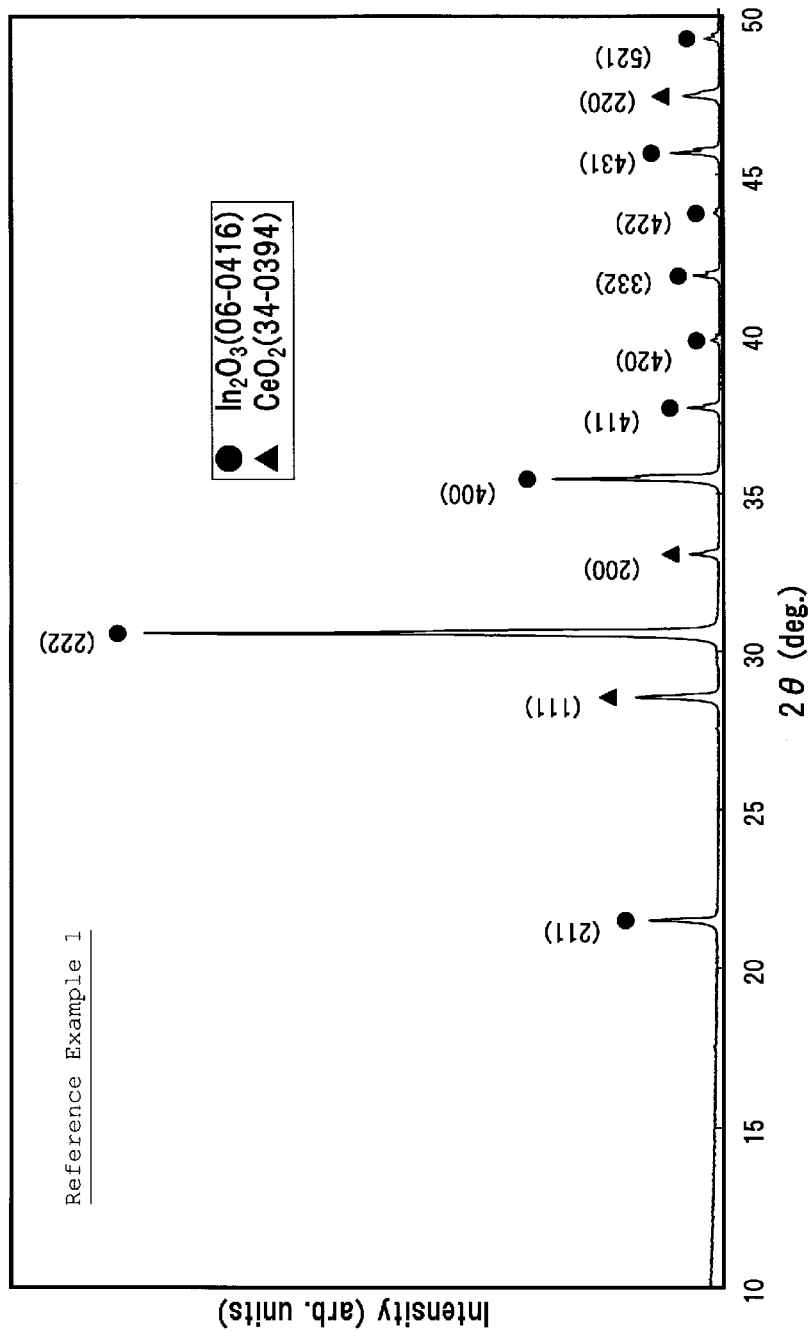
FIG. 1 is a chart showing X-ray diffraction measurement result of an oxide sintered body used in Reference Example 1.

It is preferable that such an oxide sintered body has an $In_2O_3$ phase of a bixbyite-type structure, as a main crystal phase, in which a $CeO_2$ phase of a fluorite-type structure is finely dispersed as a crystal particle having an average particle diameter of 3 µm or smaller, as shown in FIG. 1 on phase identification result of the oxide sintered body by X-ray diffraction measurement.

Cerium is seldom in a solid solution state in the $In_2O_3$ phase of a bixbyite-type structure, as a main phase. On the other hand, indium is seldom in a solid solution state also in the $CeO_2$ phase of a fluorite-type structure, as a dispersed phase. However, in both phases, in a non-equilibrium way, a part of indium may be substituted with cerium, or a part of cerium may be substituted with indium, and thus some degree of deviation from a stoichiometric composition, deficit of a metal element, or deficit of oxygen may be contained.

It is preferable that the $In_2O_3$ phase, which is a main crystal phase of such a oxide sintered body, is composed of two kinds of different average particle diameters: one kind is a relatively small crystal particle having an average particle diameter of 2 µm or smaller, more preferably 1.5 µm or smaller, and still more preferably 1 µm or smaller; and the other kind is a relatively large crystal particle having an average particle diameter of 2.5 µm or larger, and more preferably 3 to 6 µm. By composing the $In_2O_3$ phase by crystal particles with different average particle diameter, in this way, both of securing strength of the sintered body and density adjustment (to decrease density) becomes possible, resulting in film-formation without generation of crack, fracture or splash.

In addition, in the present invention, it is desirable that relationship of crystal particle diameter or a dispersed state of the $In_2O_2$ phase of a bixbyite-type structure, which is a main phase of the oxide sintered body, and the $CeO_2$ phase of a fluorite-type structure is that an intensity ratio of X-ray diffraction peaks defined by the following formula (I) is 25% or less. It is because the intensity ratio of X-ray diffraction peaks over 25% causes frequent generation of crack, fracture or splash, with progress of film-formation using an ion plating method, which gives adverse effects on crystallinity of the film. In particular, it is preferable that the intensity ratio of the X-ray diffraction peaks is 20% or lower. It should be noted that such an oxide sintered body has been described in detail, in the description of an international application by the present inventor (PCT/JP2010/062816).

$$I=[CeO_2 \text{ phase } (111)/In_2O_2 \text{ phase } (222)] \times 100 [\%] \quad (1)$$

The crystalline transparent conductive film is formed on a substrate, by using such an oxide sintered body target, arranging the substrate and the tablet inside an ion plating apparatus, maintaining the substrate at predetermined temperature in argon inert gas atmosphere containing oxygen gas, as needed, evaporating the tablet from the copper hearth using an electric gun, generating plasma at the vicinity of the substrate, to ionize tablet vapor.

In addition, it is preferable that a tablet (or it may also be referred to as a pellet) for ion plating is obtained by fabrication of the oxide sintered body having a density of 3.4 to 5.5 g/cm³. It should be noted that such an oxide sintered body has also been described in detail in the description of the PCT/JP2010/062816 by the present inventor.

The composition of the above tablet is fundamentally reproduced to film composition formed, and content of each element in the film can be changed by changing content of each element in the tablet.

In ion plating, the crystalline transparent conductive film is formed on the substrate set at a temperature of room temperature, that is, from a temperature of 20° C. or higher, to a temperature of about 300° C. It is preferable that the substrate temperature is set at 100° C. or higher to obtain a film with lower specific resistance, by increasing crystallinity of the crystalline transparent conductive film. However, in this case, crystallinity of the film formed depends also on content of each element in the film, oxygen partial pressure in inert gas atmosphere, and film-formation condition of film-formation speed or the like.

In the present invention, a transparent electric conductive substrate can be obtained by forming the above transparent conductive film on a heat resistant substrate, or on a transparent heat resistant substrate, as needed.

As the substrate, various plates or films of glass, synthetic quartz, a synthetic resin such as polyimide, a metal foil such as stainless steel foil, or the like may be used, depending on applications. In particular, in the present invention, in the case of heating to form the crystalline transparent conductive film, it is preferable to be a heat resistant substrate such as glass, synthetic quartz.

In addition, in an application of a solar cell, there may be the case of applying a roll-to-roll process or the like, and a roll-like polyimide film and a heat resistant substrate such as stainless steel is suitably used.

As explained above, the crystalline transparent conductive film of the present invention containing indium oxide as a main component, and specified amount of cerium, or the crystalline transparent conductive film further containing, as a metal element (M element), specified amount of one or more kinds of the metal element selected from the metal element group consisting of titanium, zirconium, hafnium, molybdenum and tungsten is suitably applicable to a functional element of such as a blue LED, a solar cell. In addition, it is applicable to a waveguide-type light control element utilizing relatively low specific resistance and high transmittance in an infrared region; an optical communication device such as an optical modulator element using a liquid crystal; furthermore a functional element of a liquid crystal panel, a plasma display, organic EL, inorganic EL or electronic paper or the like.

EXAMPLES

Explanation will be given below in still more detail on the present invention with reference to Examples, however, the present invention should not be limited to these Examples.
[Evaluation of Fundamental Characteristics of the Transparent Conductive Film]

Composition of the obtained transparent conductive film was studied by an ICP emission spectroscopy. Film thickness of the transparent conductive film was measured with a surface roughness tester (Alpha-Step IQ, manufactured by Tencor Japan Corp.). Film-formation rate was calculated from film thickness and film-formation time.

Surface resistance of the film was measured by a four-probe method using a resistivity meter (Loresta EP MCP-T360 model, manufactured by Dia Instruments Co., Ltd.). Specific resistance of the film was calculated from a product of surface specific resistance of the film and film thickness. Carrier electron concentration of the film and mobility thereof were determined by hole effect measurement. Refractive index of the film was measured using a spectro-elipsometer (VASE, manufactured by J. A. Woolam Co., Ltd.).

A generation phase of the film was identified by 2θ/θ measurement using an X-ray diffraction apparatus (X'PertPRO MPD, manufactured by Philips Co., Ltd.). Crystallization temperature of the film was determined by X-ray diffraction measurement at high temperature. Repeated X-ray diffraction measurement was performed in a range of 2θ=20 to 40 degree, while raising temperature of the transparent conductive film formed in a rate of 5° C. per minute, and temperature, at which diffraction peaks derived from a crystal appeared, was adopted as crystallization temperature.

Surface roughness of the film was determined by arithmetic average height, Ra, using AFM (Nanoscope III and D5000, manufactured by Digital Instruments Co., Ltd.).

Reference Example 1

Indium oxide powder and cerium oxide powder were adjusted to an average particle diameter of 1 μm or smaller to obtain raw material powder. These powders were formulated so that cerium content becomes 9% by atom, as an atomic number ratio of Ce/(In+Ce), which were put in a resin pot and mixed using a wet-type ball mill. In this case, a hard-type $ZrO_2$ ball was used and mixing time was set at 18 hours. After mixing, slurry was taken out and filtered, dried and granulated. The granulated substance was converted to a compact under a pressure of 3 ton/$cm^2$, by use of a cold isostatic press.

Then, this compact was sintered at a sintering temperature of 1400° C. for 20 hours, under atmosphere where oxygen was introduced into air inside a sintering furnace, at a rate of 5 L/minute per 0.1 $m^3$ of furnace inner volume. In this case, temperature was raised in a rate of 1° C./minute, and in cooling after completion of sintering, oxygen introduction was stopped and temperature was lowered to 1000° C. at a rate of 10° C./minute down.

The obtained oxide sintered body was fabricated to a size of 152 mm in diameter and 5 mm in thickness, and the sputtering surface thereof was polished using a cup grinding stone so that maximal height, Rz, becomes 3.0 μm or lower. The fabricated oxide sintered body was subjected to bonding to a backing plate made of oxygen-free copper using metal indium, to prepare a sputtering target.

Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, as shown in FIG. 1, it was confirmed to be composed of the $In_2O_3$ phase with a bixbyite-type structure, and the $CeO_2$ phase with a fluorite-type structure. Density of the oxide sintered body was measured and found to be 6.87 g/$cm^3$. Subsequently, texture observation of the oxide sintered body was performed with SEM, and found that average particle diameter of the $CeO_2$ phase was 1.1 μm.

Next, the sputtering target was attached to a cathode for a non-magnetic substance target of a direct-current magnetron sputtering apparatus (SPF-530H, manufactured by ANELVA Corp.) equipped with a direct-current power source not having arcing suppression function. The present sputtering apparatus has high temperature specification, in particular, for a substrate heating heater, enabling to set substrate temperature at 650° C. at the maximum. Synthetic quartz having a thickness of 0.5 mm was used as a substrate, and distance between the target and the substrate was fixed to 49 mm.

A direct-current power of 200 W was applied to generate direct-current plasma. After pre-sputtering for minutes, the substrate was arranged just over the sputtering target, that is, at a stationary opposed position, and inside of a chamber of the sputtering apparatus was exhausted to attain a vacuum degree of below $1 \times 10^{-4}$ Pa, and after confirming that the substrate temperature reached 500° C., mixed gas of argon and oxygen was introduced, so that ratio of oxygen was 1.0% to adjust gas pressure to 0.3 Pa. It should be noted that it is clarified that, in the above ratio of oxygen of 1.0%, the obtained film exhibited the lowest specific resistance.

By performing sputtering, a transparent conductive film with a film thickness of 200 nm was formed on the substrate of 500° C. It was confirmed that the composition of the obtained transparent conductive film was nearly the same as that of the target.

By measurement of specific resistance of the film, it was found to be $6.6 \times 10^{-4}$ Ω·cm. In addition, measurement of hole effect was performed and it was found that carrier electron concentration was $2.6 \times 10^{20}$ $cm^{-3}$, and carrier electron mobility was 36 $cm^2V^{-1}s^{-1}$. Refractive index of a wavelength of 460 nm was 2.21. Crystallinity of the film was investigated by X-ray diffraction measurement, and as shown in FIG. 2, it was confirmed to be a crystalline film composed of only an indium oxide phase of a bixbyite structure. Film surface roughness was measured using AFM and found that arithmetic average height, Ra, was 1.3 nm. As above, composition and film-formation conditions of the transparent conductive film are shown in Table 1, and various characteristics of the transparent conductive film are shown in Table 2. It should be noted that it is similar also in Reference example 2 and thereafter.

Reference Example 2

A transparent conductive film was formed similarly as in Reference Example 1, except by using a sputtering target made of an oxide sintered body having the cerium content is 7% by atom, as an atomic number ratio of Ce/(In+Ce). Composition of the obtained transparent conductive film was confirmed to be nearly the same as that of the target.

By measurement of specific resistance of the film, it was found to be $5.9 \times 10^{-4}$ Ω·cm. In addition, measurement of hole effect was performed and found that carrier electron concentration was $2.5 \times 10^{20}$ $cm^{-3}$, and carrier electron mobility was 42 $cm^2V^{-1}s^{-1}$. Refractive index of a wavelength of 460 nm was 2.20. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.3 nm.

Reference Example 3

A transparent conductive film was formed similarly as in Reference Example 1, except by using a sputtering target made of an oxide sintered body having the cerium content is 7% by atom, as an atomic number ratio of Ce/(In+Ce), and substrate temperature was set at 400° C. Composition of the obtained transparent conductive film was confirmed to be nearly the same as that of the target.

By measurement of specific resistance of the film, it was found to be $5.1 \times 10^{-4}$ Ω·cm. In addition, measurement of hole effect was performed and found that carrier electron concentration was $2.4 \times 10^{20}$ cm$^{-3}$, and carrier electron mobility was 51 cm$^2$V$^{-1}$s$^{-1}$. Refractive index of a wavelength of 460 nm was 2.19. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.4 nm.

Reference Example 4

A transparent conductive film was formed similarly as in Reference Example 1, except by using a sputtering target made of an oxide sintered body having the cerium content is 4% by atom, as an atomic number ratio of Ce/(In+Ce), and substrate temperature was set at 400° C. Composition of the obtained transparent conductive film was confirmed to be nearly the same as that of the target.

By measurement of specific resistance of the film, it was found to be $4.2 \times 10^{-4}$ Ω·cm. In addition, measurement of hole effect was performed and found that carrier electron concentration was $2.3 \times 10^{20}$ cm$^{-3}$, and carrier electron mobility was 65 cm$^2$V$^{-1}$s$^{-1}$. Refractive index of a wavelength of 460 nm was 2.17. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.6 nm.

Reference Example 5

A transparent conductive film was formed similarly as in Reference Example 1, except by using a sputtering target made of an oxide sintered body having the cerium content is 1% by atom, as an atomic number ratio of Ce/(In+Ce), and substrate temperature was set at 300° C. Composition of the obtained transparent conductive film was confirmed to be nearly the same as that of the target.

By measurement of specific resistance of the film, it was found to be $4.4 \times 10^{-4}$ Ω·cm. In addition, measurement of hole effect was performed and found that carrier electron concentration was $1.6 \times 10^{20}$ cm$^{-3}$, and carrier electron mobility was 88 cm$^2$V$^{-1}$s$^{-1}$. Refractive index of a wavelength of 460 nm was 2.14. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.8 nm.

Reference Example 6

A transparent conductive film was formed similarly as in Reference Example 1, except by using a sputtering target made of an oxide sintered body having the cerium content is 0.3% by atom, as an atomic number ratio of Ce/(In+Ce), and substrate temperature was set at 300° C. Composition of the obtained transparent conductive film was confirmed to be nearly the same as that of the target.

By measurement of specific resistance of the film, it was found to be $7.6 \times 10^{-4}$ Ω·cm. In addition, measurement of hole effect was performed and found that carrier electron concentration was $1.0 \times 10^{20}$ cm$^{-3}$, and carrier electron mobility was 82 cm$^2$V$^{-1}$s$^{-1}$. Refractive index of a wavelength of 460 nm was 2.13. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.8 nm.

Reference Example 7

A transparent conductive film was formed similarly as in Reference Example 1, except by using a sputtering target made of an oxide sintered body containing indium oxide, as a main component, cerium, as well as titanium, where cerium content is 9% by atom, as an atomic number ratio of Ce/(In+Ce+Ti) and titanium content is 1% by atom, as an atomic number ratio of Ti/(In+Ce+Ti), and substrate temperature was set at 400° C. Composition of the obtained transparent conductive film was confirmed to be nearly the same as that of the target.

By measurement of specific resistance of the film, it was found to be $5.6 \times 10^{-4}$ Ω·cm. In addition, measurement of hole effect was performed and found that carrier electron concentration was $3.1 \times 10^{20}$ cm$^{-3}$, and carrier electron mobility was 36 cm$^2$V$^{-1}$s$^{-1}$. Refractive index of a wavelength of 460 nm was 2.14. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.3 nm.

Nearly similar results were obtained in the case of the addition of zirconium, hafnium, molybdenum and tungsten instead of titanium.

Reference Example 8

A transparent conductive film was formed similarly as in Reference Example 1, except by using a sputtering target made of an oxide sintered body containing indium oxide, as a main component, cerium, as well as titanium, where cerium content is 5% by atom, as an atomic number ratio of Ce/(In+Ce+Ti) and titanium content is 0.5% by atom, as an atomic number ratio of Ti/(In+Ce+Ti), and substrate temperature was set at 400° C. Composition of the obtained transparent conductive film was confirmed to be nearly the same as that of the target.

By measurement of specific resistance of the film, it was found to be $5.2 \times 10^{-4}$ Ω·cm. In addition, measurement of hole effect was performed and found that carrier electron concentration was $2.7 \times 10^{20}$ cm$^{-3}$, and carrier electron mobility was 45 cm$^2$V$^{-1}$s$^{-1}$. Refractive index of a wavelength of 460 nm was 2.17. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.3 nm.

Reference Example 9

A transparent conductive film was formed similarly as in Reference Example 1, except by using a sputtering target made of an oxide sintered body containing indium oxide, as a main component, cerium, as well as titanium, where cerium content is 4% by atom, as an atomic number ratio of Ce/(In+Ce+Ti) and titanium content is 1% by atom, as an atomic number ratio of Ti/(In+Ce+Ti), and substrate temperature was set at 400° C. Composition of the obtained transparent conductive film was confirmed to be nearly the same as that of the target.

By measurement of specific resistance of the film, it was found to be $4.8 \times 10^{-4}$ Ω·cm. In addition, measurement of hole effect was performed and found that carrier electron concentration was $3.0 \times 10^{20}$ cm$^{-3}$, and carrier electron mobility was 43 cm$^2$V$^{-1}$s$^{-1}$. Refractive index of a wavelength of 460 nm was 2.16. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.4 nm.

Reference Example 10

A transparent conductive film was formed similarly as in Reference Example 1, except by using a sputtering target made of an oxide sintered body containing indium oxide, as a main component, cerium, as well as titanium, where cerium content is 0.3% by atom, as an atomic number ratio of Ce/(In+Ce+Ti) and titanium content is 0.3% by atom, as an atomic number ratio of Ti/(In+Ce+Ti), and substrate temperature was set at 300° C. Composition of the obtained transparent conductive film was confirmed to be nearly the same as that of the target.

By measurement of specific resistance of the film, it was found to be $4.4 \times 10^{-4}$ Ω·cm. In addition, measurement of hole effect was performed and found that carrier electron concentration was $1.7 \times 10^{20}$ cm$^{-3}$, and carrier electron mobility was 83 cm$^2$V$^{-1}$s$^{-1}$. Refractive index of a wavelength of 460 nm was 2.12. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.8 nm.

Reference Example 11

A transparent conductive film was formed similarly as in Reference Example 1, except by using a sputtering target made of an oxide sintered body containing indium oxide, as a main component, cerium, as well as zirconium, where cerium content is 0.3% by atom, as an atomic number ratio of Ce/(In+Ce+Zr) and zirconium content is 0.3% by atom, as an atomic number ratio of Zr/(In+Ce+Zr), and substrate temperature was set at 300° C. Composition of the obtained transparent conductive film was confirmed to be nearly the same as that of the target.

By measurement of specific resistance of the film, it was found to be $4.8 \times 10^{-4}$ Ω·cm. In addition, measurement of hole effect was performed and found that carrier electron concentration was $1.6 \times 10^{20}$ cm$^{-3}$, and carrier electron mobility was 80 cm$^2$V$^{-1}$s$^{-1}$. Refractive index of a wavelength of 460 nm was 2.12. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.8 nm.

Nearly similar results were obtained in the case of the addition of hafnium, molybdenum and tungsten in the same composition, additionally, as the case of the addition of titanium or zirconium.

Reference Example 12

A transparent conductive film was formed similarly as in Reference Example 1, except that substrate temperature was set at room temperature, that is, 25° C. Composition of the obtained transparent conductive film was confirmed to be nearly the same as that of the target.

Crystallinity of the film was investigated by X-ray diffraction measurement, and confirmed to be an amorphous film. By measurement of specific resistance of the film, it was found to be as low as $1.9 \times 10^{-3}$ Ω·cm. In addition, measurement of hole effect was performed and found that carrier electron concentration was $2.5 \times 10^{20}$ cm$^{-3}$, and carrier electron mobility was 15 cm$^2$V$^{-1}$s$^{-1}$. That is, it was found that the film had not so high carrier electron concentration, as well as low carrier electron mobility, specific to an amorphous film, causing high specific resistance.

Subsequently, heat treatment of this amorphous film was performed under nitrogen atmosphere at 500° C. for 30 minutes. As a result, specific resistance of the film was $6.9 \times 10^{-4}$ Ω·cm. In addition, measurement of hole effect was performed and found that carrier electron concentration was $2.4 \times 10^{20}$ cm$^{-3}$, and carrier electron mobility was 38 cm$^2$V$^{-1}$s$^{-1}$. Refractive index of a wavelength of 460 nm was 2.22. Crystallinity of the film was identified by X-ray diffraction measurement, and confirmed to be a crystalline film composed of an indium oxide phase of a bixbyite-type structure only. Film surface roughness was measured using AFM and found that arithmetic average height, Ra, was 1.3 nm.

Next, a patterning test was performed by wet etching using a weak acid using another sample of an amorphous film formed as above. As an etchant, "ITO-06N", manufactured by Kanto Chemical Co., Inc. was used, which contains a weak organic acid, oxalic acid, as a main component. Fabrication to a predetermined shape was performed at an etchant temperature of 40° C., and it was confirmed that patterning was possible without any problem.

Reference Example 13

A transparent conductive film was formed similarly as in Reference Example 1, except by using a sputtering target made of an oxide sintered body having the cerium content is 5% by atom, as an atomic number ratio of Ce/(In+Ce), and substrate temperature was set at room temperature, that is, 25° C. Composition of the obtained transparent conductive film was confirmed to be nearly the same as that of the target.

Crystallinity of the film was investigated by X-ray diffraction measurement, and confirmed to be an amorphous film. By measurement of specific resistance of the film, it was found to be $8.3 \times 10^{-4}$ Ω·cm. In addition, measurement of hole effect was performed and found that carrier electron concentration was $4.4 \times 10^{20}$ cm$^{-3}$, and carrier electron mobility was 17 cm$^2$V$^{-1}$s$^{-1}$. That is, it was found that the film had not so high carrier electron concentration, as well as low carrier electron mobility, specific to an amorphous film, causing high specific resistance.

Subsequently, heat treatment of this amorphous film was performed under nitrogen atmosphere at 400° C. for 30 minutes. As a result, specific resistance of the film was 4.9×10$^{-4}$ Ω·cm. In addition, measurement of hole effect was performed and found that carrier electron concentration was 2.2×10$^{20}$ cm$^{-3}$, and carrier electron mobility was 58 cm$^2$V$^{-1}$s$^{-1}$. Refractive index of a wavelength of 460 nm was 2.20. Crystallinity of the film was identified by X-ray diffraction measurement, and confirmed to be a crystalline film composed of an indium oxide phase of a bixbyite-type structure only. Film surface roughness was measured using AFM and found that arithmetic average height, Ra, was 1.3 nm.

Figure 3:
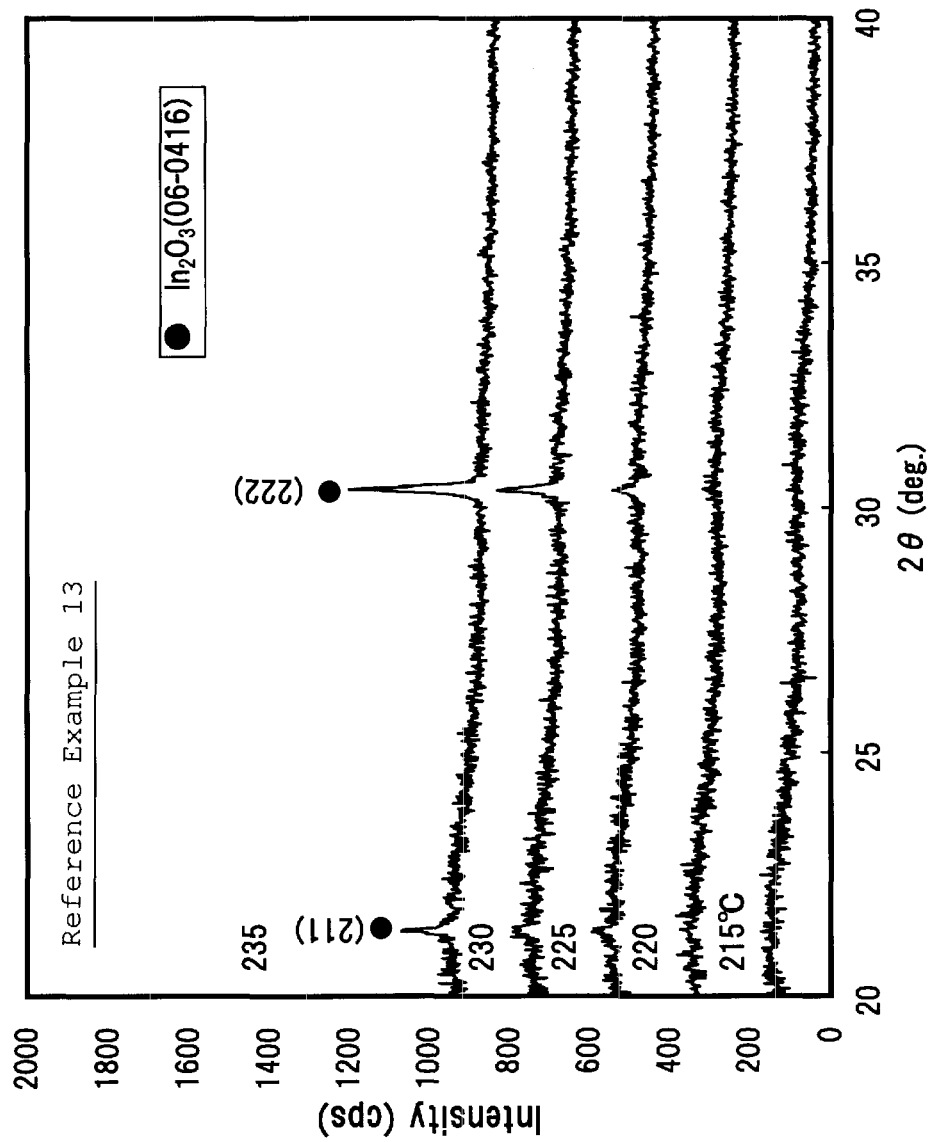
FIG. 3 is a chart showing X-ray diffraction measurement result investigated the temperature, at which the film changes to a crystalline state, that is, crystallization temperature, by performing X-ray diffraction measurement while raising temperature by heating an amorphous transparent conductive film formed at room temperature, in Reference Example 13.

It should be noted that a crystallization temperature was determined by X-ray diffraction measurement at high temperature using another amorphous film prepared by the same way as above. As a result, as shown in FIG. 3, it was clarified that the crystallization temperature was 220 to 225° C., that is, lower than the above heat treatment temperature.

Next, a patterning test was performed by wet etching using a weak acid using another sample of an amorphous film formed similarly as above. As an etchant, "ITO-06N", manufactured by Kanto Chemical Co., Inc. was used, which contains a weak organic acid, oxalic acid, as a main component. Fabrication to a predetermined shape was performed at an etchant temperature of 40° C., however, it was clarified that patterning was not possible with little progress of etching. As a result of SEM observation, a fine crystal was observed in the amorphous film and it was clarified that this fine crystal caused patterning impossible.

Comparative Example 1

A transparent conductive film was formed similarly as in Reference Example 1, except by using a sputtering target made of an oxide sintered body having the cerium content is 0.1% by atom, as an atomic number ratio of Ce/(In+Ce), and substrate temperature was set at 300° C. Composition of the obtained transparent conductive film was confirmed to be nearly the same as that of the target.

By measurement of specific resistance of the film, it was found to be a relatively high value of 1.5×10$^{-3}$ Ω·cm. In addition, measurement of hole effect was performed and found that carrier electron concentration was 6.2×10$^{19}$ cm$^{-3}$, and carrier electron mobility was 68 cm$^2$V$^{-1}$s$^{-1}$. Refractive index of a wavelength of 460 nm was 2.12. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.9 nm.

Comparative Example 2

A transparent conductive film was formed similarly as in Reference Example 1, except by using a sputtering target made of an oxide sintered body having the cerium content is 11% by atom, as an atomic number ratio of Ce/(In+Ce), and substrate temperature was set at 500° C. Composition of the obtained transparent conductive film was confirmed to be nearly the same as that of the target.

By measurement of specific resistance of the film, it was found to be a relatively high value of 1.0×10$^{-3}$ Ω·cm. In addition, measurement of hole effect was performed and found that carrier electron concentration was 2.8×10$^{20}$ cm$^{-3}$, and carrier electron mobility was 22 cm$^2$V$^{-1}$s$^{-1}$. Refractive index of a wavelength of 460 nm was 2.18. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.3 nm.

Comparative Example 3

A transparent conductive film was formed similarly as in Reference Example 1, except by using a sputtering target made of an oxide sintered body containing indium oxide, as a main component, cerium, as well as titanium, where cerium content is 5% by atom, as an atomic number ratio of Ce/(In+Ce+Ti) and titanium content is 3% by atom, as an atomic number ratio of Ti/(In+Ce+Ti), and substrate temperature was set at 400° C. Composition of the obtained transparent conductive film was confirmed to be nearly the same as that of the target.

By measurement of specific resistance of the film, it was found to be 4.2×10$^{-4}$ Ω·cm. In addition, measurement of hole effect was performed and found that carrier electron concentration was 6.2×10$^{20}$ cm$^{-3}$, and carrier electron mobility was 24 cm$^2$V$^{-1}$s$^{-1}$. Refractive index of a wavelength of 460 nm was 2.07. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.3 nm.

Comparative Example 4

A transparent conductive film was formed similarly as in Reference Example 1, except by using a sputtering target made of an oxide sintered body containing indium oxide, as a main component, cerium, as well as tin, where cerium content is 0.3% by atom, as an atomic number ratio of Ce/(In+Ce+Sn) and tin content is 3% by atom, as an atomic number ratio of Sn/(In+Ce+Sn), and substrate temperature was set at 300° C. Composition of the obtained transparent conductive film was confirmed to be nearly the same as that of the target.

By measurement of specific resistance of the film, it was found to be 2.6×10$^{-4}$ Ω·cm. In addition, measurement of hole effect was performed and found that carrier electron concentration was 7.3×10$^{20}$ cm$^{-3}$, and carrier electron mobility was 33 cm$^2$V$^{-1}$s$^{-1}$. Refractive index of a wavelength of 460 nm was 2.04. Crystallinity of the film was investigated by X-ray diffraction measurement, and confirmed to be a crystalline film composed of only an indium oxide phase of a bixbyite structure. Film surface roughness was measured using AFM and found that arithmetic average height, Ra, was 1.7 nm.

Comparative Example 5

A transparent conductive film was formed similarly as in Reference Example 1, except by using a sputtering target made of an oxide sintered body having the cerium content is 20% by atom, as an atomic number ratio of Ce/(In+Ce), and substrate temperature was set at room temperature, that is, 25° C., as well as mixed gas of argon and oxygen, where ratio of oxygen was adjusted at 0.2%, was introduced as sputtering gas. Composition of the obtained transparent conductive film was confirmed to be nearly the same as that of the target.

By measurement of specific resistance of the film, it was found to be a very high value of 2.6×10$^{-2}$ Ω·cm. In addition, measurement of hole effect was performed and found that carrier electron concentration was 3.0×10$^{19}$ cm$^{-3}$, and carrier electron mobility was 8 cm$^2$V$^{-1}$s$^{-1}$. In addition, refractive index of a wavelength of 460 nm was 2.25. Crystallinity of the film was investigated by X-ray diffraction measurement, and confirmed to be an amorphous film.

Subsequently, heating treatment of this amorphous film was performed under nitrogen atmosphere at 220° C. for minutes, similarly as in the PATENT LITERATURE 2. Specific resistance of the film was 1.5×10$^{-2}$ Ω·cm, a high level of 10$^{-2}$ Ω·cm order. Crystallinity of the film was investigated by X-ray diffraction measurement, and confirmed to be maintained in an amorphous film state. Film surface roughness was measured using AFM and found that arithmetic average height, Ra, was 0.3 nm. Still more, heating treatment of this film was performed under nitrogen atmosphere at 300° C. for 60 minutes. Specific resistance of the film was 1.2×10$^{-2}$ Ω·cm, without changing from a high value, although there was a slight decrease. Carrier electron concentration was 5.2×10$^{22}$ cm$^{-3}$, and carrier electron mobility was 10 cm$^2$V$^{-1}$s$^{-1}$. Crystallinity of the film was investigated by X-ray diffraction measurement, and confirmed to be maintained in an amorphous film state. Film surface roughness was measured using AFM and found that arithmetic average height, Ra, was 0.4 nm.

Figure 4:
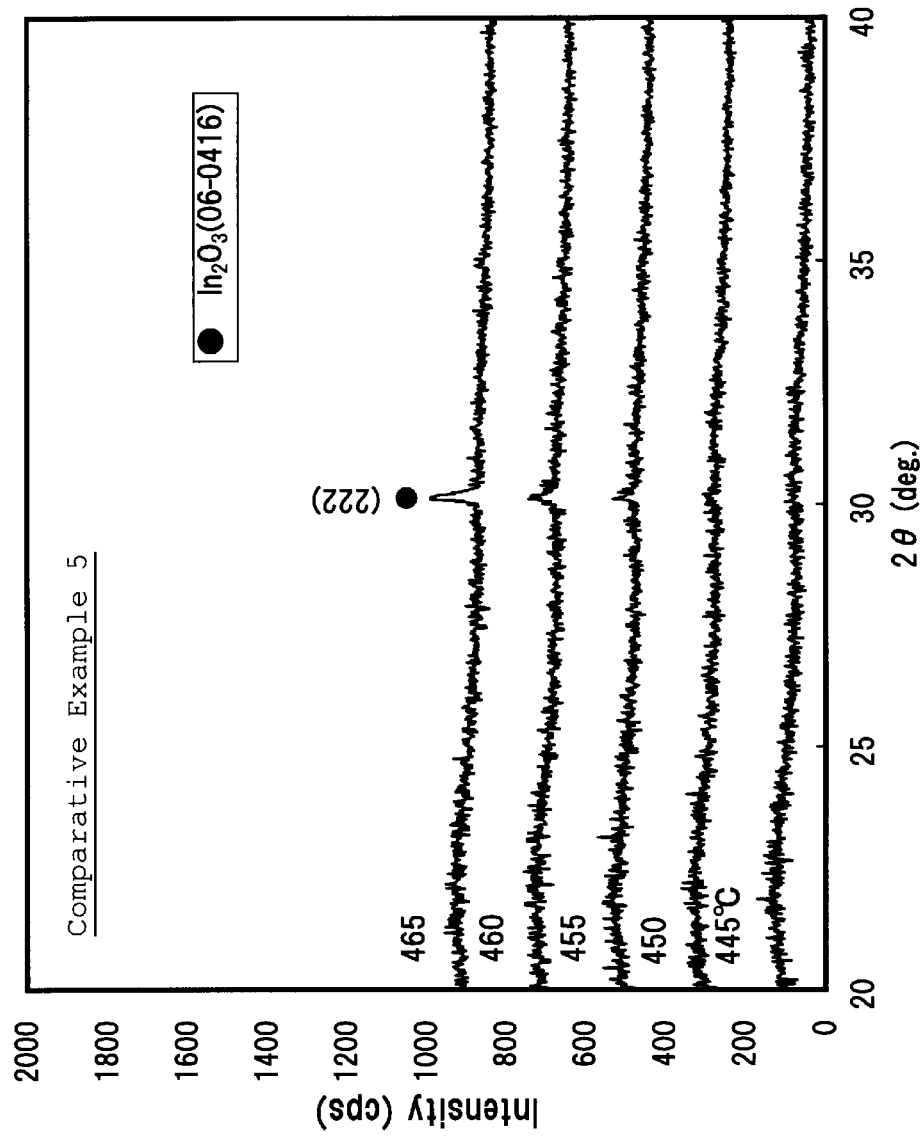
FIG. 4 is a chart showing X-ray diffraction measurement result investigated in Comparative Example 5 the crystallization temperature, by performing X-ray diffraction measurement while raising temperature by heating an amorphous transparent conductive film formed at room temperature, for comparison purpose.

A crystallization temperature was measured by X-ray diffraction measurement at high temperature using another amorphous film prepared by the same way as above. As a result, as shown in FIG. 4, it was clarified that the crystallization temperature was 445 to 450° C., that is, higher than the above heating treatment temperature.

Example 1

Film-formation of a transparent conductive film was performed by changing to an ion plating method using a tablet composed of an oxide sintered body having a cerium content of 0.8% by atom, as an atomic number ratio represented by Ce/(In+Ce).

Figure 5:
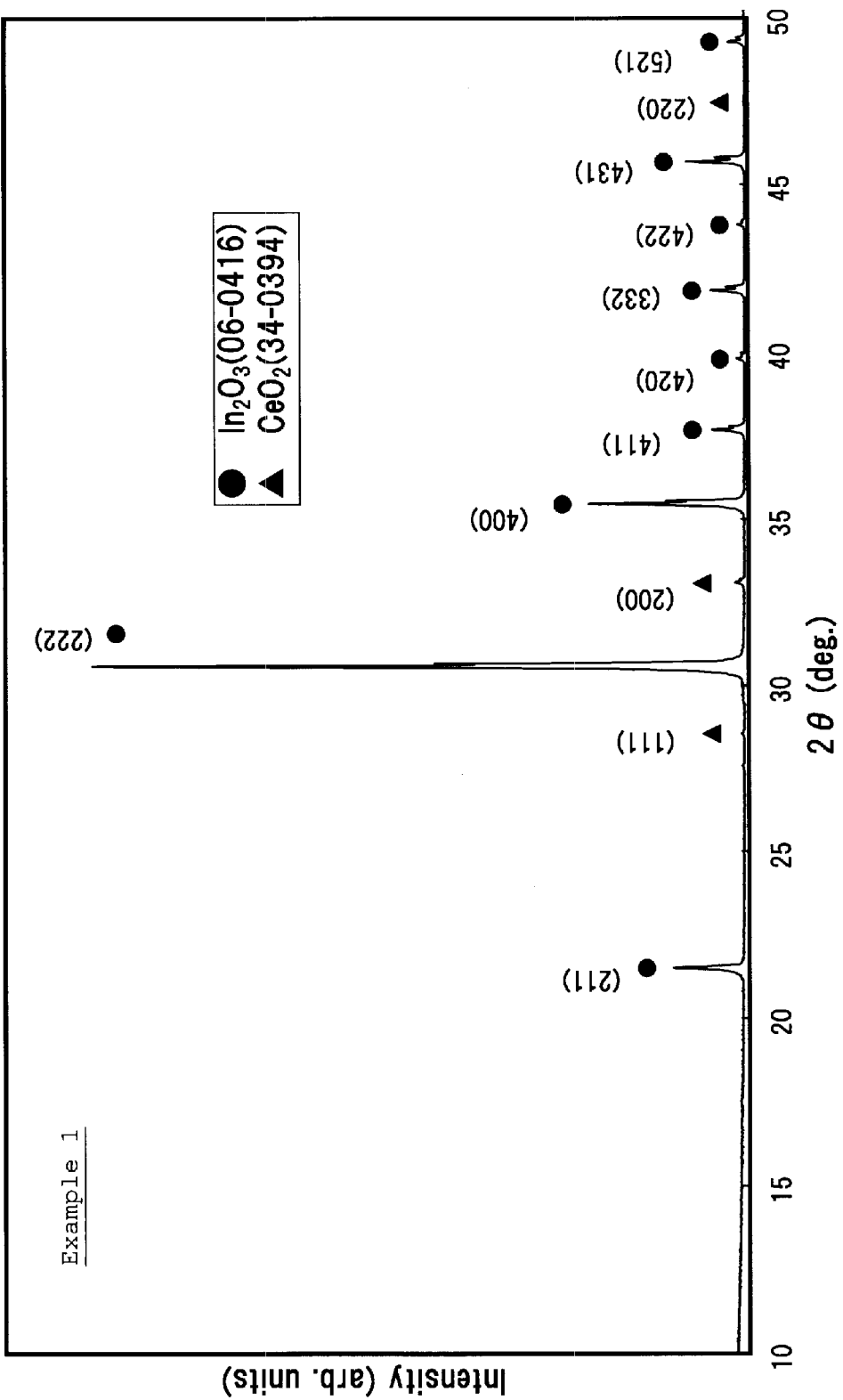
FIG. 5 is a chart showing X-ray diffraction measurement result of an oxide sintered body used in the present invention (Example 1).

A method for preparing the oxide sintered body was nearly the same as in the case of the sputtering target of Reference Example 1, however, as described above, in the case of using as the tablet for ion plating, it is necessary to decrease density, therefore, it was decided to use indium oxide powder having two kinds of average particle diameters, and selected indium oxide powder adjusted so as to have an average particle diameter of 3 μm, in addition to the above indium oxide powder adjusted to have an average particle diameter of 1 μm or smaller. From similar reason, sintering temperature was set at 1100° C. The tablet was compacted in advance so as to attain dimension after sintering of a diameter of 30 mm and a height of 40 mm. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase. That is, result similar to the sputtering target of Reference Example 1 (FIG. 1) was obtained. Density of the oxide sintered body was measured and found to be 4.56 g/cm$^3$. Subsequently, texture observation of the oxide sintered body was performed with SEM, and found that average particle diameter of a crystal particle composed of the CeO$_2$ phase was 1.0 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be 3.6×10$^{-4}$ Ω·cm. In addition, measurement of hole effect was performed and found that carrier electron concentration was 1.9×10$^{20}$ cm$^{-3}$, and carrier electron mobility was 91 cm$^2$V$^{-1}$s$^{-1}$. Refractive index of a wavelength of 460 nm was 2.12. Crystallinity of the film was identified by X-ray diffraction measurement, and it was confirmed that cerium was in a solid solution state in the indium phase, and it was a crystalline film composed of an indium oxide phase of a bixbyite-type structure only. That is, similar results to the transparent conductive film formed by sputtering target of Reference Example 1, were obtained (FIG. 2). Film surface roughness was measured using AFM and found that arithmetic average height, Ra, was 0.8 nm.

Example 2

Film-formation was formed similarly as in Example 1, by an ion plating method, except by using a tablet made of an oxide sintered body having a cerium content of 2% by atom, as an atomic number ratio of Ce/(In+Ce), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase. Density of the oxide sintered body was measured and found to be 4.67 g/cm$^3$. Subsequently, texture observation of the oxide sintered body was performed with SEM, and found that average particle diameter of a crystal particle composed of the CeO$_2$ phase was 1.0 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the obtained transparent conductive film was nearly the same as that of the target.

By measurement of specific resistance of the film, it was found to be $3.3 \times 10^{-4}$ Ω·cm. In addition, measurement of hole effect was performed and found that carrier electron concentration was $2.1 \times 10^{20}$ cm$^{-3}$, and carrier electron mobility was 90 cm$^2$V$^{-1}$s$^{-1}$. Refractive index of a wavelength of 460 nm was 2.13. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 3

Film-formation was formed similarly as in Example 1, by an ion plating method, except by using a tablet made of an oxide sintered body having a cerium content of 9% by atom, as an atomic number ratio of Ce/(In+Ce), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.90 g/cm$^3$. Subsequently, texture observation of the oxide sintered body was performed with SEM, and found that average particle diameter of a crystal particle composed of the $CeO_2$ phase was 1.1 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the obtained transparent conductive film was nearly the same as that of the target.

By measurement of specific resistance of the film, it was found to be $5.4 \times 10^{-4}$ Ω·cm. In addition, measurement of hole effect was performed and found that carrier electron concentration was $2.9 \times 10^{20}$ cm$^{-3}$, and carrier electron mobility was 40 cm$^2$V$^{-1}$s$^{-1}$. Refractive index of a wavelength of 460 nm was 2.19. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.5 nm.

Example 4

Film-formation was formed similarly as in Example 1, by an ion plating method, except by using a tablet made of an oxide sintered body having a cerium content of 5% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.74 g/cm$^3$. Subsequently, texture observation of the oxide sintered body was performed with SEM, and found that average particle diameter of a crystal particle composed of the $CeO_2$ phase was 1.1 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.8 \times 10^{-4}$ Ω·cm. In addition, measurement of hole effect was performed and found that carrier electron concentration was $2.6 \times 10^{20}$ cm$^{-3}$, and carrier electron mobility was 64 cm$^2$V$^{-1}$s$^{-1}$. Refractive index of a wavelength of 460 nm was 2.17. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.6 nm.

Example 5

Film-formation was formed similarly as in Example 1, by an ion plating method, except by using a tablet made of an oxide sintered body having a cerium content of 4% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase. Density of the oxide sintered body was measured and found to be 4.71 g/cm$^3$. Subsequently, texture observation of the oxide sintered body was performed with SEM, and found that average particle diameter of a crystal particle composed of the CeO$_2$ phase was 1.1 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.4 \times 10^{-4}$ Ω·cm. In addition, measurement of hole effect was performed and found that carrier electron concentration was $2.5 \times 10^{20}$ cm$^{-3}$, and carrier electron mobility was 73 cm$^2$V$^{-1}$s$^{-1}$. Refractive index of a wavelength of 460 nm was 2.15. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.7 nm.

Example 6

Film-formation was formed similarly as in Example 1, by an ion plating method, except by using a tablet made of an oxide sintered body having a cerium content of 2.4% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase. Density of the oxide sintered body was measured and found to be 4.68 g/cm$^3$. Subsequently, texture observation of the oxide sintered body was performed with SEM, and found that average particle diameter of a crystal particle composed of the CeO$_2$ phase was 1.0 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.6 \times 10^{-4}$ Ω·cm. In addition, measurement of hole effect was performed and found that carrier electron concentration was $2.2 \times 10^{20}$ cm$^{-3}$, and carrier electron mobility was 79 cm$^2$V$^{-1}$s$^{-1}$. Refractive index of a wavelength of 460 nm was 2.14. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase.

Film surface roughness was measured using AFM and found that arithmetic average height, Ra, was 0.8 nm.

Example 7

Film-formation was formed similarly as in Example 1, by an ion plating method, except by using a tablet made of an oxide sintered body having a cerium content of 1.6% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.64 g/cm³. Subsequently, texture observation of the oxide sintered body was performed with SEM, and found that average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.4 \times 10^{-4}$ Ω·cm. In addition, measurement of hole effect was performed and found that carrier electron concentration was $2.1 \times 10^{20}$ cm⁻³, and carrier electron mobility was 87 cm²V⁻¹s⁻¹. Refractive index of a wavelength of 460 nm was 2.12. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 8

Film-formation was formed similarly as in Example 1, by an ion plating method, except by using a tablet made of an oxide sintered body having a cerium content of 1% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.58 g/cm³. Subsequently, texture observation of the oxide sintered body was performed with SEM, and found that average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.4 \times 10^{-4}$ Ω·cm. In addition, measurement of hole effect was performed and found that carrier electron concentration was $2.0 \times 10^{20}$ cm⁻³, and carrier electron mobility was 93 cm²V⁻¹s⁻¹. Refractive index of a wavelength of 460 nm was 2.12. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 9

Film-formation was formed similarly as in Example 1, by an ion plating method, except by using a tablet made of an oxide sintered body having a cerium content of 0.3% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.52 g/cm$^3$. Subsequently, texture observation of the oxide sintered body was performed with SEM, and found that average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $4.3 \times 10^{-4}$ Ω·cm. In addition, measurement of hole effect was performed and found that carrier electron concentration was $1.6 \times 10^{20}$ cm$^{-3}$, and carrier electron mobility was 90 cm$^2$V$^{-1}$s$^{-1}$. Refractive index of a wavelength of 460 nm was 2.13. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 10

Film-formation was formed similarly as in Example 1, by an ion plating method, except by using a target made of an oxide sintered body containing cerium, as well as titanium, where cerium content is 8% by atom, as an atomic number ratio of Ce/(In+Ce+Ti) and titanium content is 1% by atom, as an atomic number ratio of Ti/(In+Ce+Ti), and substrate temperature was set at 300° C. The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase.

Density of the oxide sintered body was measured and found to be 4.52 g/cm$^3$. Subsequently, texture observation of the oxide sintered body was performed with SEM, and found that average particle diameter of a crystal particle composed of the $CeO_2$ phase was 1.2 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the obtained transparent conductive film was nearly the same as that of the target.

By measurement of specific resistance of the film, it was found to be $5.1 \times 10^{-4}$ Ω·cm. In addition, measurement of hole effect was performed and found that carrier electron concentration was $3.2 \times 10^{20}$ cm$^{-3}$, and carrier electron mobility was 38 cm$^2$V$^{-1}$s$^{-1}$. Refractive index of a wavelength of 460 nm was 2.11. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.6 nm.

Example 11

Film-formation was formed similarly as in Example 1, by an ion plating method, except by using a target made of an oxide sintered body containing cerium, as well as titanium, where cerium content is 5% by atom, as an atomic number ratio of Ce/(In+Ce+Ti) and titanium content is 0.5% by atom, as an atomic number ratio of Ti/(In+Ce+Ti), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.87 g/cm$^3$. Subsequently, texture observation of the oxide sintered body was performed with SEM, and found that average particle diameter of a crystal particle composed of the $CeO_2$ phase was 1.1 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $4.1 \times 10^{-4}$ Ω·cm. In addition, measurement of hole effect was performed and found that carrier electron concentration was $2.7 \times 10^{20}$ $cm^{-3}$, and carrier electron mobility was 57 $cm^2V^{-1}s^{-1}$. Refractive index of a wavelength of 460 nm was 2.16. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.6 nm.

Example 12

Film-formation was formed similarly as in Example 1, by an ion plating method, except by using a target made of an oxide sintered body containing cerium, as well as titanium, where cerium content is 4% by atom, as an atomic number ratio of Ce/(In+Ce+Ti) and titanium content is 1% by atom, as an atomic number ratio of Ti/(In+Ce+Ti), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.84 $g/cm^3$. Subsequently, texture observation of the oxide sintered body was performed with SEM, and found that average particle diameter of a crystal particle composed of the $CeO_2$ phase was 1.2 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.5 \times 10^{-4}$ Ω·cm. In addition, measurement of hole effect was performed and found that carrier electron concentration was $2.9 \times 10^{20}$ $cm^{-3}$, and carrier electron mobility was 61 $cm^2V^{-1}s^{-1}$. Refractive index of a wavelength of 460 nm was 2.15. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.7 nm.

Example 13

Film-formation was formed similarly as in Example 1, by an ion plating method, except by using a target made of an oxide sintered body containing cerium, as well as titanium, where cerium content is 0.3% by atom, as an atomic number ratio of Ce/(In+Ce+Ti) and titanium content is 0.3% by atom, as an atomic number ratio of Ti/(In+Ce+Ti), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase.

Density of the oxide sintered body was measured and found to be 4.55 $g/cm^3$. Subsequently, texture observation of the oxide sintered body was performed with SEM, and found that average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.7 \times 10^{-4}$ Ω·cm. In addition, measurement of hole effect was performed and found that carrier electron concentration was $1.9 \times 10^{20}$ cm$^{-3}$, and carrier electron mobility was 89 cm$^2$V$^{-1}$s$^{-1}$. Refractive index of a wavelength of 460 nm was 2.12. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 14

Film-formation was formed similarly as in Example 1, by an ion plating method, except by using a target made of an oxide sintered body containing cerium, as well as zirconium, where cerium content is 0.3% by atom, as an atomic number ratio of Ce/(In+Ce+Zr) and titanium content is 0.3% by atom, as an atomic number ratio of Zr/(In+Ce+Zr), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.53 g/cm$^3$. Subsequently, texture observation of the oxide sintered body was performed with SEM, and found that average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $3.9 \times 10^{-4}$ Ω·cm. In addition, measurement of hole effect was performed and found that carrier electron concentration was $1.8 \times 10^{20}$ cm$^{-3}$, and carrier electron mobility was 88 cm$^2$V$^{-1}$s$^{-1}$. Refractive index of a wavelength of 460 nm was 2.12. Crystallinity of the film was identified by X-ray diffraction measurement, and confirmed, similarly as in Example 1, to be a crystalline film composed of an indium oxide phase of a bixbyite-type structure only, and cerium to be in a solid solution state in the indium phase. Film surface roughness was measured using AFM and found that arithmetic average height, Ra, was 0.8 nm.

Example 15

Film-formation was formed similarly as in Example 1, by an ion plating method, except by using a tablet made of an oxide sintered body having a cerium content of 9% by atom, as an atomic number ratio of Ce/(In+Ce), and substrate temperature was set at room temperature.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.90 g/cm$^3$. Subsequently, texture observation of the oxide sintered body was performed with SEM, and found that average particle diameter of a crystal particle composed of the $CeO_2$ phase was 1.1 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 25°

C. to form a transparent conductive film with a film thickness of 200 nm. It was confirmed that the composition of the obtained transparent conductive film was nearly the same as that of the target.

By measurement of specific resistance of the film, it was found to be $6.0\times10^{-4}$ Ω·cm. In addition, measurement of hole effect was performed and found that carrier electron concentration was $2.8\times10^{20}$ cm$^{-3}$, and carrier electron mobility was 37 cm$^2$V$^{-1}$s$^{-1}$. Refractive index of a wavelength of 460 nm was 2.18. Crystallinity of the film was identified by X-ray diffraction measurement, and confirmed, similarly as in Example 1, to be a crystalline film composed of an indium oxide phase of a bixbyite-type structure only. Film surface roughness was measured using AFM and found that arithmetic average height, Ra, was 0.5 nm.

Example 16

Film-formation was formed similarly as in Example 1, by an ion plating method, except by using a tablet made of an oxide sintered body having a cerium content of 5% by atom, as an atomic number ratio of Ce/(In+Ce), and substrate temperature was set at room temperature.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase.

Density of the oxide sintered body was measured and found to be 4.74 g/cm$^3$. Subsequently, texture observation of the oxide sintered body was performed with SEM, and found that average particle diameter of a crystal particle composed of the CeO$_2$ phase was 1.1 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 25° C. to form a transparent conductive film with a film thickness of 200 nm. It was confirmed that the composition of the obtained transparent conductive film was nearly the same as that of the target.

By measurement of specific resistance of the film, it was found to be $4.0\times10^{-4}$ Ω·cm. In addition, measurement of hole effect was performed and found that carrier electron concentration was $2.5\times10^{20}$ cm$^{-3}$, and carrier electron mobility was 62 cm$^2$V$^{-1}$s$^{-1}$. Refractive index of a wavelength of 460 nm was 2.14. Crystallinity of the film was identified by X-ray diffraction measurement, and confirmed, similarly as in Example 1, to be a crystalline film composed of an indium oxide phase of a bixbyite-type structure only. Film surface roughness was measured using AFM and found that arithmetic average height, Ra, was 0.7 nm.

Example 17

Film-formation was formed similarly as in Example 1, by an ion plating method, except by using a tablet made of an oxide sintered body having a cerium content of 1.6% by atom, as an atomic number ratio of Ce/(In+Ce), and substrate temperature was set at room temperature.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase with a bixbyite-type structure, and the CeO$_2$ phase with a fluorite-type structure, as shown in FIG. 5, where cerium was not in a solid solution state in the indium phase. Density of the oxide sintered body was measured and found to be 4.64 g/cm$^3$. Subsequently, texture observation of the oxide sintered body was performed with SEM, and found that average particle diameter of a crystal particle composed of the CeO$_2$ phase was 1.0 μm. In addition, it was confirmed to satisfy that the crystal particle of the In$_2$O$_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and O$_2$ flow rate at 10 sccm. A problem of splash or the like did not occur during a period until the tablet became not usable.

After replacing the tablet, film-formation was performed. It should be noted that substrate temperature was set at 25° C. to form a transparent conductive film with a film thickness of 200 nm. It was confirmed that the composition of the obtained transparent conductive film was nearly the same as that of the target.

By measurement of specific resistance of the film, it was found to be $3.6\times10^{-4}$ Ω·cm. In addition, measurement of hole effect was performed and found that carrier electron concentration was $2.0\times10^{20}$ cm$^{-3}$, and carrier electron mobility was 88 cm$^2$V$^{-1}$s$^{-1}$. Refractive index of a wavelength of 460 nm was 2.12. Crystallinity of the film was identified by X-ray diffraction measurement, and confirmed, similarly as in Example 1, to be a crystalline film composed of an indium oxide phase of a bixbyite-type structure only.

Film surface roughness was measured using AFM and found that arithmetic average height, Ra, was 0.8 nm.

Comparative Example 6

Film-formation was formed by an ion plating method, using a tablet made of an oxide sintered body having a cerium content of 0.1% by atom, as an atomic number ratio of Ce/(In+Ce).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure only, different from FIG. 5. Density of the oxide sintered body was measured and found to be 4.49 g/cm$^3$. Subsequently, texture observation of the oxide sintered body was performed with SEM, and observed presence of an extremely small amount of the $CeO_2$ phase in a dot state. Average particle diameter of a crystal particle composed of the $CeO_2$ phase was 1.0 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $9.9 \times 10^{-4}$ Ω·cm. In addition, measurement of hole effect was performed and found that carrier electron concentration was $8.3 \times 10^{19}$ cm$^{-3}$, and carrier electron mobility was 76 cm$^2$V$^{-1}$s$^{-1}$. Refractive index of a wavelength of 460 nm was 2.11. Crystallinity of the film was identified by X-ray diffraction measurement, and confirmed, similarly as in Example 1, to be a crystalline film composed of an indium oxide phase of a bixbyite-type structure only. Film surface roughness was measured using AFM and found that arithmetic average height, Ra, was 0.8 nm.

Comparative Example 7

Film-formation was formed similarly as in Example 1, by an ion plating method, except by using a tablet made of an oxide sintered body having a cerium content of 11% by atom, as an atomic number ratio of Ce/(In+Ce), and substrate temperature was set at 300° C.

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure, and the $CeO_2$ phase with a fluorite-type structure, as shown in FIG. 5, where cerium was not in a solid solution state in the indium phase. Density of the oxide sintered body was measured and found to be 4.96 g/cm$^3$. Subsequently, texture observation of the oxide sintered body was performed with SEM, and found that average particle diameter of a crystal particle composed of the $CeO_2$ phase was 1.1 μm. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the obtained transparent conductive film was nearly the same as that of the target.

By measurement of specific resistance of the film, it was found to be $8.4 \times 10^{-4}$ Ω·cm. In addition, measurement of hole effect was performed and found that carrier electron concentration was $3.1 \times 10^{20}$ cm$^{-3}$, and carrier electron mobility was 24 cm$^2$V$^{-1}$s$^{-1}$. Refractive index of a wavelength of 460 nm was 2.18. Crystallinity of the film was identified by X-ray diffraction measurement, and confirmed, similarly as in Example 1, to be a crystalline film composed of an indium oxide phase of a bixbyite-type structure only. Film surface roughness was measured using AFM and found that arithmetic average height, Ra, was 0.5 nm.

Comparative Example 8

Film-formation was formed similarly as in Example 1, by an ion plating method, except by using a target made of an oxide sintered body containing cerium, as well as titanium, where cerium content is 0.3% by atom, as an atomic number ratio of Ce/(In+Ce+Ti) and titanium content is 3% by atom, as an atomic number ratio of Ti/(In+Ce+Ti).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure only, similarly as in FIG. 5, where cerium was not in a solid solution state in the indium phase, and only titanium was in a solid solution state in the indium phase. Density of the oxide sintered body was measured and found to be 4.55 g/cm$^3$. Subsequently, texture observation of the oxide sintered body was performed with SEM, but a crystal particle composed of the $CeO_2$ phase was not confirmed. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $4.1 \times 10^{-4}$ Ω·cm. In addition, measurement of hole effect was performed and found that carrier electron concentration was $6.9 \times 10^{20}$ cm$^{-3}$, and carrier electron mobility was 22 cm$^2$V$^{-1}$s$^{-1}$. Refractive index of a wavelength of 460 nm was 2.05. Crystallinity of the film was identified by X-ray diffraction measurement, and confirmed, similarly as in Example 1, to be a crystalline film composed of an indium oxide phase of a bixbyite-type structure only, and cerium and titanium to be in a solid solution state in the indium phase. Film surface roughness was measured using AFM and found that arithmetic average height, Ra, was 1.2 nm.

Comparative Example 9

Film-formation was formed similarly as in Example 1, by an ion plating method, except by using a target made of an oxide sintered body containing cerium, as well as tin, where cerium content is 0.3% by atom, as an atomic number ratio of Ce/(In+Ce+Sn) and tin content is 3% by atom, as an atomic number ratio of Sn/(In+Ce+Sn).

The oxide sintered body was prepared by a similar method as in Example 1. Composition analysis of the obtained oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase with a bixbyite-type structure only, different from FIG. 5. Density of the oxide sintered body was measured and found to be 4.61 g/cm$^3$. Subsequently, texture observation of the oxide sintered body was performed with SEM, but a crystal particle composed of the $CeO_2$ phase was not confirmed. In addition, it was confirmed to satisfy that the crystal particle of the $In_2O_3$ phase is composed of two kinds of different average particle diameters: one kind is a relatively small crystal particle having an average particle diameter of 2 μm or smaller; and the other kind is a relatively large crystal particle having an average particle diameter of 2.5 μm or larger.

Discharge was continued, using a plasma gun by an ion plating method, using such an oxide sintered body by fabrication as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 200° C. to form a transparent conductive film with a film thickness of 200 nm. It was confirmed that the composition of the obtained transparent conductive film was nearly the same as that of the target.

By measurement of specific resistance of the film, it was found to be $2.3 \times 10^{-4}$ Ω·cm. In addition, measurement of hole effect was performed and found that carrier electron concentration was $7.6 \times 10^{20}$ cm$^{-3}$, and carrier electron mobility was 36 cm$^2$V$^{-1}$s$^{-1}$. Refractive index of a wavelength of 460 nm was 2.02. Crystallinity of the film was identified by X-ray diffraction measurement, and confirmed, similarly as in Example 1, to be a crystalline film composed of an indium oxide phase of a bixbyite-type structure only, and cerium and tin to be in a solid solution state in the indium phase. Film surface roughness was measured using AFM and found that arithmetic average height, Ra, was 1.1 nm.

TABLE 1

| | Ce/(In + Ce) (% by atom) | M element | Ce/(In + Ce + M) (% by atom) | Ce/(In + Ce + M) (% by atom) | Substrate temperature (° C.) | Heat treatment temperature (° C.) |
|---|---|---|---|---|---|---|
| Reference Example 1 | 9 | — | — | — | 500 | — |
| Reference Example 2 | 7 | — | — | — | 500 | — |
| Reference Example 3 | 5 | — | — | — | 400 | — |
| Reference Example 4 | 4 | — | — | — | 400 | — |

TABLE 1-continued

| | Ce/(In + Ce) (% by atom) | M element | Ce/(In + Ce + M) (% by atom) | Ce/(In + Ce + M) (% by atom) | Substrate temperature (° C.) | Heat treatment temperature (° C.) |
|---|---|---|---|---|---|---|
| Reference Example 5 | 1 | — | — | — | 300 | — |
| Reference Example 6 | 0.3 | — | — | — | 300 | — |
| Reference Example 7 | — | Ti | 8 | 1 | 400 | — |
| Reference Example 8 | — | Ti | 5 | 0.5 | 400 | — |
| Reference Example 9 | — | Ti | 4 | 1 | 400 | — |
| Reference Example 10 | — | Ti | 0.3 | 0.3 | 300 | — |
| Reference Example 11 | — | Zr | 0.3 | 0.3 | 300 | — |
| Reference Example 12 | 9 | — | — | — | 25 | 500 |
| Reference Example 13 | 5 | — | — | — | 25 | 400 |
| Comparable Example 1 | 0.1 | — | — | — | 300 | — |
| Comparable Example 2 | 11 | — | — | — | 500 | — |
| Comparable Example 3 | — | Ti | 5 | 3 | 400 | — |
| Comparable Example 4 | — | Sn | 0.3 | 3 | 300 | — |
| Comparable Example 5 | 20 | — | — | — | 25 | 220 300 |
| Example 1 | 0.8 | — | — | — | 200 | — |
| Example 2 | 2 | — | — | — | 300 | — |
| Example 3 | 9 | — | — | — | 300 | — |
| Example 4 | 5 | — | — | — | 200 | — |
| Example 5 | 4 | — | — | — | 200 | — |
| Example 6 | 2.4 | — | — | — | 200 | — |
| Example 7 | 1.6 | — | — | — | 200 | — |
| Example 8 | 1 | — | — | — | 200 | — |
| Example 9 | 0.3 | — | — | — | 200 | — |
| Example 10 | — | Ti | 8 | 1 | 300 | — |
| Example 11 | — | Ti | 5 | 0.5 | 200 | — |
| Example 12 | — | Ti | 4 | 1 | 200 | — |
| Example 13 | — | Ti | 0.3 | 0.3 | 200 | — |
| Example 14 | — | Zr | 0.3 | 0.3 | 200 | — |
| Example 15 | 9 | — | — | — | 25 | — |
| Example 16 | 5 | — | — | — | 25 | — |
| Example 17 | 1.6 | — | — | — | 25 | — |
| Comparable Example 6 | 0.1 | — | — | — | 200 | — |
| Comparable Example 7 | 11 | — | — | — | 300 | — |
| Comparable Example 8 | — | Ti | 0.3 | 3 | 200 | — |
| Comparable Example 9 | — | Sn | 0.3 | 3 | 200 | — |

TABLE 2

| | Specific resistance ($\Omega \cdot cm$) | Carrier electron concentration ($cm^{-3}$) | Carrier electron mobility ($cm^2 V^{-1} s^{-1}$) | Refractive index | Arithmetic average height (Ra) (nm) | Generated phase of a thin film |
|---|---|---|---|---|---|---|
| Reference Example 1 | $6.6 \times 10^{-4}$ | $2.6 \times 10^{20}$ | 36 | 2.21 | 1.3 | $In_2O_3$ phase of bixbyite-type structure |
| Reference Example 2 | $5.4 \times 10^{-4}$ | $2.5 \times 10^{20}$ | 46 | 2.20 | 1.3 | $In_2O_3$ phase of bixbyite-type structure |
| Reference Example 3 | $4.6 \times 10^{-4}$ | $2.4 \times 10^{20}$ | 57 | 2.19 | 1.4 | $In_2O_3$ phase of bixbyite-type structure |
| Reference Example 4 | $4.2 \times 10^{-4}$ | $2.3 \times 10^{20}$ | 65 | 2.17 | 1.6 | $In_2O_3$ phase of bixbyite-type structure |

TABLE 2-continued

| | Specific resistance ($\Omega \cdot cm$) | Carrier electron concentration ($cm^{-3}$) | Carrier electron mobility ($cm^2 V^{-1} s^{-1}$) | Refractive index | Arithmetic average height (Ra) (nm) | Generated phase of a thin film |
|---|---|---|---|---|---|---|
| Reference Example 5 | $4.4 \times 10^{-4}$ | $1.6 \times 10^{20}$ | 88 | 2.14 | 1.8 | $In_2O_3$ phase of bixbyite-type structure |
| Reference Example 6 | $7.6 \times 10^{-4}$ | $1.3 \times 10^{20}$ | 82 | 2.13 | 1.8 | $In_2O_3$ phase of bixbyite-type structure |
| Reference Example 7 | $5.6 \times 10^{-4}$ | $3.1 \times 10^{20}$ | 36 | 2.14 | 1.3 | $In_2O_3$ phase of bixbyite-type structure |
| Reference Example 8 | $5.4 \times 10^{-4}$ | $2.5 \times 10^{20}$ | 46 | 2.17 | 1.3 | $In_2O_3$ phase of bixbyite-type structure |
| Reference Example 9 | $5.0 \times 10^{-4}$ | $2.5 \times 10^{20}$ | 50 | 2.16 | 1.4 | $In_2O_3$ phase of bixbyite-type structure |
| Reference Example 10 | $5.0 \times 10^{-4}$ | $1.5 \times 10^{20}$ | 83 | 2.12 | 1.8 | $In_2O_3$ phase of bixbyite-type structure |
| Reference Example 11 | $5.2 \times 10^{-4}$ | $1.5 \times 10^{20}$ | 80 | 2.12 | 1.8 | $In_2O_3$ phase of bixbyite-type structure |
| Reference Example 12 | $6.9 \times 10^{-4}$ | $2.4 \times 10^{20}$ | 38 | 2.22 | 1.3 | $In_2O_3$ phase of bixbyite-type structure |
| Reference Example 13 | $4.9 \times 10^{-4}$ | $2.2 \times 10^{20}$ | 58 | 2.20 | 1.3 | $In_2O_3$ phase of bixbyite-type structure |
| Comparable Example 1 | $1.5 \times 10^{-3}$ | $6.2 \times 10^{19}$ | 68 | 2.12 | 1.9 | $In_2O_3$ phase of bixbyite-type structure |
| Comparable Example 2 | $1.0 \times 10^{-3}$ | $2.8 \times 10^{20}$ | 22 | 2.18 | 1.3 | $In_2O_3$ phase of bixbyite-type structure |
| Comparable Example 3 | $4.2 \times 10^{-4}$ | $6.2 \times 10^{20}$ | 24 | 2.07 | 1.3 | $In_2O_3$ phase of bixbyite-type structure |
| Comparable Example 4 | $2.6 \times 10^{-4}$ | $7.3 \times 10^{20}$ | 33 | 2.04 | 1.7 | $In_2O_3$ phase of bixbyite-type structure |
| Comparable Example 5 | $1.5 \times 10^{-4}$ | — | — | — | 0.3 | Amorphous |
| Example 1 | $1.2 \times 10^{-4}$ | $7.3 \times 10^{20}$ | 10 | 2.24 | 0.4 | Amorphous |
| | $3.6 \times 10^{-4}$ | $1.9 \times 10^{20}$ | 91 | 2.12 | 0.8 | $In_2O_3$ phase of bixbyite-type structure |
| Example 2 | $3.3 \times 10^{-4}$ | $2.1 \times 10^{20}$ | 90 | 2.13 | 0.8 | $In_2O_3$ phase of bixbyite-type structure |
| Example 3 | $5.4 \times 10^{-4}$ | $2.9 \times 10^{20}$ | 40 | 2.19 | 0.5 | $In_2O_3$ phase of bixbyite-type structure |
| Example 4 | $3.8 \times 10^{-4}$ | $2.6 \times 10^{20}$ | 64 | 2.17 | 0.6 | $In_2O_3$ phase of bixbyite-type structure |
| Example 5 | $3.4 \times 10^{-4}$ | $2.5 \times 10^{20}$ | 73 | 2.15 | 0.7 | $In_2O_3$ phase of bixbyite-type structure |
| Example 6 | $3.6 \times 10^{-4}$ | $2.2 \times 10^{20}$ | 79 | 2.14 | 0.8 | $In_2O_3$ phase of bixbyite-type structure |
| Example 7 | $3.4 \times 10^{-4}$ | $2.1 \times 10^{20}$ | 87 | 2.12 | 0.8 | $In_2O_3$ phase of bixbyite-type structure |
| Example 8 | $3.4 \times 10^{-4}$ | $2.0 \times 10^{20}$ | 93 | 2.12 | 0.8 | $In_2O_3$ phase of bixbyite-type structure |
| Example 9 | $4.3 \times 10^{-4}$ | $1.6 \times 10^{20}$ | 90 | 2.13 | 0.8 | $In_2O_3$ phase of bixbyite-type structure |
| Example 10 | $5.1 \times 10^{-4}$ | $3.2 \times 10^{20}$ | 38 | 2.11 | 0.6 | $In_2O_3$ phase of bixbyite-type structure |
| Example 11 | $4.1 \times 10^{-4}$ | $2.7 \times 10^{20}$ | 57 | 2.16 | 0.6 | $In_2O_3$ phase of bixbyite-type structure |

TABLE 2-continued

| | Specific resistance (Ω·cm) | Carrier electron concentration (cm$^{-3}$) | Carrier electron mobility (cm$^2$V$^{-1}$s$^{-1}$) | Refractive index | Arithmetic average height (Ra) (nm) | Generated phase of a thin film |
|---|---|---|---|---|---|---|
| Example 12 | $3.5 \times 10^{-4}$ | $2.9 \times 10^{20}$ | 61 | 2.15 | 0.7 | In$_2$O$_3$ phase of bixbyite-type structure |
| Example 13 | $3.7 \times 10^{-4}$ | $1.9 \times 10^{20}$ | 89 | 2.12 | 0.8 | In$_2$O$_3$ phase of bixbyite-type structure |
| Example 14 | $3.9 \times 10^{-4}$ | $1.8 \times 10^{20}$ | 88 | 2.12 | 0.8 | In$_2$O$_3$ phase of bixbyite-type structure |
| Example 15 | $6.0 \times 10^{-4}$ | $2.8 \times 10^{20}$ | 37 | 2.18 | 0.5 | In$_2$O$_3$ phase of bixbyite-type structure |
| Example 16 | $4.0 \times 10^{-4}$ | $2.5 \times 10^{20}$ | 62 | 2.14 | 0.7 | In$_2$O$_3$ phase of bixbyite-type structure |
| Example 17 | $3.6 \times 10^{-4}$ | $2.0 \times 10^{20}$ | 88 | 2.12 | 0.8 | In$_2$O$_3$ phase of bixbyite-type structure |
| Comparable Example 6 | $9.9 \times 10^{-4}$ | $8.3 \times 10^{19}$ | 76 | 2.11 | 0.8 | In$_2$O$_3$ phase of bixbyite-type structure |
| Comparable Example 7 | $8.4 \times 10^{-4}$ | $3.1 \times 10^{20}$ | 24 | 2.18 | 0.5 | In$_2$O$_3$ phase of bixbyite-type structure |
| Comparable Example 8 | $4.1 \times 10^{-4}$ | $6.9 \times 10^{20}$ | 22 | 2.05 | 1.2 | In$_2$O$_3$ phase of bixbyite-type structure |
| Comparable Example 9 | $2.3 \times 10^{-4}$ | $7.6 \times 10^{20}$ | 36 | 2.02 | 1.1 | In$_2$O$_3$ phase of bixbyite-type structure |

(Evaluation)

From the result shown in Table 1, Examples 1 to 9 and 15 to 17 are crystalline transparent conductive films containing indium and cerium as oxides, wherein indium oxide is contained as a main component, and cerium content is in a range of 0.3 to 9% by atom, as an atomic number ratio of Ce/(In+Ce); which is formed using an ion plating method; and a crystal phase is formed only by the In$_2$O$_3$ phase of a bixbyite structure, and film surface is smooth as having an arithmetic average height (Ra) of 1.0 nm or lower. Therefore, they have such a superior characteristics as refractive index in a wavelength of 460 nm of 2.1 or higher, specific resistance of $8 \times 10^{-4}$ Ω·cm or lower, and mobility of 35 cm$^2$V$^{-1}$s$^{-1}$ or higher. In particular, by adding only cerium to indium oxide, as a main component, and by adopting an ion plating method as a film-formation method, superior film surface smoothness is obtained. In addition, as for optical characteristics, due to suppression of carrier electron concentration low, a refractive index in a wavelength of 460 nm of such high value as over 2.1 is obtained.

In addition, Examples 10 to 14 are crystalline transparent conductive films containing indium, cerium and the M element as oxides, and having a composition range of cerium content of 0.3 to 8% by atom, as an atomic number ratio of Ce/(In+Ce+M), and content of one or more kinds of M element selected from the metal element group consisting of titanium, zirconium, hafnium, molybdenum and tungsten M element, of 1% by atom, as an atomic number ratio of M/(In+Ce+M)), and thus have a similar thin film structure as the transparent conductive films of Examples 1 to 9, and 15 to 17, and superior film surface smoothness, optical characteristics and electric characteristics.

On the other hand, it is understood that Reference Examples 1 to 13, as well as Comparative Examples 1 and 2 are crystalline transparent conductive films having similar composition as that in Examples 1 to 17, having equivalent optical characteristics and electrical characteristics as those in Examples 1 to 17, however, arithmetic average height (Ra) of the film surface is over 1.0 nm, caused by film-formation using an sputtering method, thus loosing smoothness.

Still more, in Comparative Example 3, not only film surface smoothness was inferior, caused by film-formation using a sputtering method, but also the crystalline transparent conductive film formed had too high carrier electron concentration, because the M element was titanium, and titanium content was as high as 3% by atom, as an atomic number ratio of Ti/(In+Ce+Ti), resulting in not attaining a refractive index of 2.1 or higher, required in an application of a blue LED or the like.

In addition, the crystalline transparent conductive film of Comparative Example 4 contains tin, other than indium and cerium, different from composition elements of the transparent conductive film of the present invention, in 3% by atom, as an atomic number ratio of Sn/(In+Ce+Sn). Because of containing tin, and film was formed using a sputtering method, the crystalline transparent electron conductive film formed was not only inferior in smoothness of film surface, but also exhibited a refractive index of 2.04, due to too high carrier electron concentration, thus not attaining a refractive index of 2.1 or higher, required in an application of a blue LED or the like.

Comparative Example 5 contains still higher cerium content of 20% by atom, as an atomic number ratio of Ce/(In+Ce), than in Comparative Example 2. Such high cerium content raises crystallization temperature up to 445 to 450° C., and thus makes the transparent conductive film formed at low temperature of around room temperature, amorphous.

In addition, even by heating treatment at 220° C. or 300° C., that is, lower than crystallization temperature, under non-oxidative nitrogen atmosphere, an amorphous state was maintained and improvement of characteristics such as decrease in specific resistance was not recognized. It is understood that the amorphous transparent conductive film of Comparative Example 5 has a typical composition as disclosed, for example, in the PATENT LITERATURE 1, and because of heating treatment at a lower temperature of 220° C., than crystallization temperature, as disclosed in Examples of the PATENT LITERATUREs 1 to 3, a crystalline state is not attained, and electric characteristics and optical characteristics are not improved.

In Comparative Example 6, as compared with Examples 1 to 9, and 15 to 17, the cerium content was set at 0.1% by atom, as an atomic number ratio of Ce/(In+Ce), outside the range of the present invention. Because of too low cerium content, the crystalline transparent conductive film, although formed using an ion plating method, was not able to form sufficient carrier electron concentration, and exhibited a specific resistance of $9.9 \times 10^{-4}$ Ω·cm, not attaining the specific resistance of $8 \times 10^{-4}$ Ω·cm or lower, required in an application of a blue LED or a solar cell or the like.

Similarly, in Comparative Example 7, the cerium content is set at 11% by atom, as an atomic number ratio of Ce/(In+Ce), outside the range of the present invention. Because of too high cerium content, the crystalline transparent conductive film formed using the ion plating method had low carrier electron mobility, and exhibited a specific resistance of $8.4 \times 10^{-4}$ Ω·cm, not attaining the specific resistance of $8.0 \times 10^{-4}$ Ω·cm or lower, required in an application of a blue LED or a solar cell or the like.

In Comparative Example 8, although the film was formed using an ion plating method, because the M element contained other than cerium was titanium, and the titanium content was set at a too high level of 3% by atom, as an atomic number ratio of Ti/(In+Ce+Ti), the crystalline transparent conductive film formed was inferior in film surface smoothness and still more had high carrier electron concentration, resulting in not attaining the refractive index of 2.1 or higher, required in an application of a blue LED or the like.

In addition, the crystalline transparent conductive film of Comparative Example 9 contains tin different from the composition element of the transparent conductive film of the present invention, in 3% by atom, as an atomic number ratio of Sn/(In+Ce+Sn), other than indium and cerium. Because of containing tin other than cerium, the crystalline transparent conductive film, although film-formation is made using the ion plating method, was inferior in film surface smoothness and had too high carrier electron concentration, and exhibited a refractive index of 2.02, not attaining the refractive index of 2.1 or higher, required in an application of a blue LED or the like.

INDUSTRIAL APPLICABILITY

The transparent conductive film of the present invention is applicable to a blue LED, and enables to match consistency with refractive index of this transparent conductive film and a gallium nitride layer, which is a light emitting layer of the blue LED, and is capable of enhancing taking out efficiency of light from the gallium nitride layer, which is a light emitting layer.

In addition, the transparent conductive film of the present invention is utilizable as a part of a rear face electrode of a solar cell, and is capable of enhancing incorporation efficiency of solar light, because this transparent conductive film enables to increase refractive index, as compared with a conventional ITO film having low incorporation efficiency of solar light. Still more, this transparent conductive film can be used as a surface electrode of a solar cell. A conventional ITO film had high carrier electron concentration, high reflectance or absorption of infrared ray and low transmittance, although having low specific resistance, however, the transparent conductive film of the present invention has low specific resistance, high refractive index, as well as high transmittance of not only visible light but also infrared light, and still more suppressed light scattering due to smooth film surface, and enables to be a substitution material as having various characteristics over the ITO film.

The invention claimed is:

1. A crystalline transparent conductive film consisting of indium oxide as a main component, and cerium, wherein:
    cerium content is 0.3 to 9% by atom, as an atomic number ratio of Ce/(In+Ce);
    arithmetic average height (Ra) is 1.0 nm or lower, and specific resistance is $8 \times 10^{-4}$ Ω·cm or lower.

2. A crystalline transparent conductive film consisting of indium oxide as a main component, cerium, and a metal element (M element), wherein:
    cerium content is 0.3 to 9% by atom, as an atomic number ratio of Ce/(In+Ce+M);
    M element content is 1% by atom or lower, as an atomic number ratio of M/(In+Ce+M);
    specific resistance is $8 \times 10^{-4}$ Ω·cm or lower;
    and arithmetic average height (Ra) is 1.0 nm or lower, wherein the M element is titanium.

3. The transparent conductive film according to claim 1, wherein refractive index of a wavelength of 460 nm is 2.1 or larger.

4. The transparent conductive film according claim 1, wherein carrier electron mobility is 35 $cm^2V^{-1}s^{-1}$ or higher.

5. The transparent conductive film according to claim 1, wherein the cerium content is 0.3 to 5% by atom, as an atomic number ratio of Ce/(In+Ce), and specific resistance is $5.0 \times 10^{-4}$ Ω·cm or lower.

6. The transparent conductive film according to claim 5, wherein the cerium content is 0.8 to 5% by atom, as an atomic number ratio of Ce/(In+Ce), and specific resistance is $4.0 \times 10^{-4}$ Ω·cm or lower.

7. The transparent conductive film according to claim 2, wherein:
    cerium content is 0.3 to 5% by atom, as an atomic number ratio of Ce/(In+Ce+M);
    M element content is 1% by atom or lower, as an atomic number ratio of M/(In+Ce+M); and
    specific resistance is $5.0 \times 10^{-4}$ Ω·cm or lower.

* * * * *